United States Patent
Paukner et al.

(10) Patent No.: US 10,930,473 B2
(45) Date of Patent: Feb. 23, 2021

(54) APPARATUS AND METHOD FOR PLASMA SYNTHESIS OF CARBON NANOTUBES

(71) Applicant: FGV CAMBRIDGE NANOSYSTEMS LIMITED, Cambridge (GB)

(72) Inventors: Catharina Paukner, Cambridge (GB); Lukasz Kurzepa, Cambridge (GB); Krzysztof Kazimierz Koziol, Cambridge (GB)

(73) Assignee: FGV Cambridge Nanosystems Limited, Cambridge (GB)

(*) Notice: Subject to any disclaimer, the term of this patent is extended or adjusted under 35 U.S.C. 154(b) by 196 days.

(21) Appl. No.: 16/062,650

(22) PCT Filed: Dec. 14, 2016

(86) PCT No.: PCT/GB2016/053938
§ 371 (c)(1),
(2) Date: Jun. 15, 2018

(87) PCT Pub. No.: WO2017/103588
PCT Pub. Date: Jun. 22, 2017

(65) Prior Publication Data
US 2019/0006151 A1 Jan. 3, 2019

(30) Foreign Application Priority Data
Dec. 15, 2015 (GB) .................................... 1522106

(51) Int. Cl.
*H01J 37/32* (2006.01)
*C01B 32/162* (2017.01)
(Continued)

(52) U.S. Cl.
CPC ....... *H01J 37/32229* (2013.01); *B01J 19/088* (2013.01); *B01J 19/126* (2013.01);
(Continued)

(58) Field of Classification Search
None
See application file for complete search history.

(56) References Cited

U.S. PATENT DOCUMENTS

| | | | |
|---|---|---|---|
| 6,998,103 B1 * | 2/2006 | Phillips | B82Y 30/00 423/447.3 |
| 2003/0211030 A1 | 11/2003 | Olivier | |

(Continued)

FOREIGN PATENT DOCUMENTS

| | | |
|---|---|---|
| GB | 2490355 | 10/2012 |
| RU | 2522636 | 7/2014 |

(Continued)

OTHER PUBLICATIONS

Iijima, S., "Helical microtubules of graphitic carbon", Nature,. vol. 35, pp. 56-58, 1991.
(Continued)

*Primary Examiner* — Kishor Mayekar
(74) *Attorney, Agent, or Firm* — Bookoff McAndrews, PLLC

(57) ABSTRACT

Apparatus and method for plasma synthesis of carbon nanotubes couple a plasma nozzle to a reaction tube/chamber. A process gas comprising a carbon-containing species is supplied to the plasma nozzle. Radio frequency radiation is supplied to the process gas within the plasma nozzle, so as to sustain a plasma within the nozzle in use, and thereby cause cracking of the carbon-containing species. The plasma nozzle is arranged such that an afterglow of the plasma extends into the reaction tube/chamber. The cracked carbon-containing species also pass into the reaction tube/chamber. The cracked carbon-containing species recombine within the afterglow, so as to form carbon nanotubes in the presence of a catalyst.

9 Claims, 14 Drawing Sheets

(51) Int. Cl.
  *C01B 32/164* (2017.01)
  *B01J 19/12* (2006.01)
  *H05H 1/30* (2006.01)
  *B01J 19/08* (2006.01)
  *H05H 1/46* (2006.01)
  *B82Y 40/00* (2011.01)

(52) U.S. Cl.
  CPC .......... *B01J 19/129* (2013.01); *C01B 32/162* (2017.08); *C01B 32/164* (2017.08); *H01J 37/32174* (2013.01); *H01J 37/32192* (2013.01); *H01J 37/32311* (2013.01); *H01J 37/32449* (2013.01); *H01J 37/32522* (2013.01); *H05H 1/30* (2013.01); *H05H 1/46* (2013.01); *B01J 2219/0869* (2013.01); *B01J 2219/0875* (2013.01); *B01J 2219/0892* (2013.01); *B01J 2219/0898* (2013.01); *B82Y 40/00* (2013.01); *H05H 2001/4622* (2013.01)

(56) References Cited

U.S. PATENT DOCUMENTS

| | | | |
|---|---|---|---|
| 2005/0163696 | A1 | 7/2005 | Uhm |
| 2007/0048211 | A1 | 3/2007 | Jiang |

FOREIGN PATENT DOCUMENTS

| | | |
|---|---|---|
| WO | 2003062146 | 7/2003 |
| WO | 2004046030 | 6/2004 |
| WO | 2006096964 | 9/2006 |
| WO | 2010094972 | 8/2010 |
| WO | 2012147054 | 11/2012 |

OTHER PUBLICATIONS

Harris, P.J.F., "Carbon Nanotube Science Synthesis, properties and applications", 2009.

Andrews, R., et al.,"Continuous production of aligned carbon nanotubes: a step closer to commercial realization", Chemical Physics Letters, vol. 303, pp. 467-474. doi: 10.1016/S0009-2614(99)00282-1, 1999.

Bronikowski, M.J., et al., "Gas-phase production of carbon single-walled nanotubes from carbon monoxide via the HiPco process: A parametric study", J. Vac. Sci. Technol. A, vol. 19, pp. 1800-1805, 2001.

Wang, Y., et al., "The large-scale production of carbon nanotubes in a nano-agglomerate fluidized-bed reactor", Chemical Physics Letters, vol. 364, pp. 568-572, doi: 10.1016/S0009-2614(02)01384-2, 2002.

Sundaram, R.M., et al., "Continuous Direct Spinning of Fibers of Single-Walled Carbon Nanotubes with Metallic Chirality", Advanced Materials, vol. 23, pp. 5064-5068, doi: 10.1002/adma.201102754, 2011.

Bell, M.S., et al., "Characterisation of the Growth Mechanism during PECVD of Multiwalled Carbon Nanotubes", Carbon, Topics in Applied Physics, vol. 100, pp. 77-93, 2006.

Zajíčková, L., et al., "Atmospheric pressure microwave torch for synthesis of carbon nanotubes", Plasma Phys. Control. Fusion, vol. 47, pp. B655-B666, 2005. "Characterization of carbon nanotubes deposited in microwave torch at atmospheric pressure", Plasma Process., Polym. 4, 5245-5249), 2007.

Zajíčková, L., et al., "Characterization of carbon nanotubes deposited in microwave torch at atmospheric pressure", Plasma Process., Polym., vol. 4, pp. S245-S249, 2007.

Jašek, O., et al., "Carbon nanotubes synthesis in microwave plasma torch at atmospheric pressure", Material Sci. Engin. C, vol. 26, pp. 1189-1193, 2006.

Jašek, O., et al., "Discussion of important factors in deposition of carbon nanotubes by atmospheric pressure microwave plasma torch", Phys. Chem. Solids, vol. 68, pp. 738-743, 2007.

Chen, C.K, et al., "Plasma torch production of macroscopic carbon nanotube structures", Carbon, vol. 41, pp. 2555-2560, 2003.

United Kingdom Search Report in corresponding UK appl. No. GB1522106.2, dated Jul. 12, 2016.

International Search Report in corresponding international appl. No. PCT/GB2016/053938, dated Mar. 7, 2017.

Written Opinion in corresponding international appl. No. PCT/GB2016/053938, dated Mar. 24, 2017.

* cited by examiner 500 nm 100 nm

APPARATUS AND METHOD FOR PLASMA SYNTHESIS OF CARBON NANOTUBES

FIELD OF THE INVENTION

The present invention relates to an apparatus and method for plasma synthesis of carbon nanotubes. It is particularly applicable, but by no means limited, to the production of carbon nanotubes using atmospheric pressure microwave plasma.

BACKGROUND TO THE INVENTION

Carbon nanotubes, then referred to as 'tubular fullerenes', were first observed by Iijima in 1991 as 'micro tubules of graphitic carbon' [1].

To date, Chemical Vapour Deposition (CVD) is the most commonly used method for synthesizing carbon nanotubes (CNTs), as it is possible to produce a high quantity of CNTs at low cost. During CVD, metal catalyst particles are placed on a substrate which is heated in a reactor at 700-1000° C. A hydrocarbon source (usually gaseous such as e.g. methane or ethylene) is then introduced into the furnace along with a process gas (such as ammonia, nitrogen or hydrogen). During the reaction, the hydrocarbon gases dissociate, producing carbon. Nanotubes then grow on the metal catalyst particles [2].

A variety of carbon sources, such as methane, ethene, acetylene, ethanol, methanol and benzene, as well as other hydrocarbons, can be utilised to make single-walled nanotubes (SWNTs) at various temperatures using catalytic methods. The growth mechanism is not yet fully understood and is being actively studied by various research groups across the world.

The active catalysts used for CNT synthesis are transition metals, classically Fe, Co and Ni, but also Mo as well as combinations of the different metals. In recent years it has been shown that SWNTs can be produced using metals with very low or no carbon interaction, including Au, Ag and Cu. Furthermore, non-metal catalysts were also identified for the formation of nanotubes like e.g. $SiO_2$, $ZrO_2$.

The choice of the ideal catalyst depends on the carbon feedstock as well as the substrate used and the NT morphology aimed for. The catalyst precursor may be solid, liquid or gaseous and can be placed inside the furnace or fed in continuously from outside. Often metallocenes (ferrocene, cobaltocene, nickelocene) serve this purpose but also others, such as nitrates and carbonyls are frequently used [2].

Procedures have been developed for introducing the catalyst in the gas phase during growth. This process involves dissolving a compound containing the catalyst in an organic solvent and injecting this solution into the reactor. The advantage here is that catalyst can be continually introduced into the reactor, opening up the potential of continuous production of CNTs.

CVD leads to relatively high yields of CNTs but the tubes show more structural defects than those produced by arc or laser evaporation methods. However the advantages of the CVD method, which make it preferred to other available synthesis methods, are purer production with fewer carbonaceous impurities and lower synthesis temperatures (550-1000° C.). Thus the process is cheaper and more easily accessible for lab applications. The CVD process has been scaled up commercially, especially for multi-walled nanotubes (MWNTs) [3].

Smalley and co workers developed a mass production of SWNTs by what has been branded as "high pressure carbon monoxide (HiPCO)" technique [4]. MWNTs can also be mass produced, with laboratories working at the kilogram/hour scale even with nanotubes of controlled diameter [5]. However, CVD is an inefficient method of obtaining active species for the synthesis of nanotubes. Cracking of the hydrocarbon relies on heat and the presence of a catalyst, and the efficiency of the cracking process is significantly below 50%, dependent on the carbon source. This is why the relative amount of the material that can be produced is small.

A correlation between the size of the catalyst particles and the nanotube diameter has been demonstrated that is in close agreement with step nucleation models [6].

The diameter of NTs grown both on substrate as well as in flow furnaces with a floating catalyst only differ slightly from the catalyst nanoparticle size. Hence, by controlling the size of the latter this can be used to grow CNTs of controlled diameter.

In order to exploit the large scale potential of CNTs, the present work focuses on a plasma approach as a synthesis technique. Plasma synthesis of CNTs is a "bottom-up" technique, of which plasma enhanced CVD (PECVD) and thermal plasmas have been reported in the literature, PECVD is an enhancement of CVD that usually requires low-pressure operation and substrates [7]. Both limit greatly the scalability of the process for industrial purposes. Low pressure not only requires more sophisticated equipment but also naturally reduces the amount of feedstock that can be provided to the system. The use of plasma torches operating at atmospheric pressure has been one of the ways forward to overcome the low-pressure limitations. Work in this area has been carried out by Zajíčková et al. [8], Jašek et al. [9] and Chen et al. [10]. In Zajíčková et al. [8] and Jašek et al. [9], a low power plasma torch was used to decompose an independent stream of carbon feedstock for the synthesis of CNTs on a silicon substrate. In Chen et al, [10], a low power (<1000 W) microwave plasma torch was used, with CO as carbon feedstock gas, to yield about 25 mg/hr of CNTs. In both cases, the use of substrate or the low power of the plasma torch is still a limiting factor to scale up.

There is therefore a desire to be able to carry out plasma synthesis of CNTs on a larger scale.

At the industrial level, several inventions using plasma systems at atmospheric pressure without substrates are worth mentioning as further background art. WO 03/062146 A1 uses the plasma torch to form the catalyst particles from metal precursors. A traditional furnace is later used to grow nanotubes on the catalyst particles similar to more traditional gas phase CVD processes. CA 2645330 uses an inductively coupled plasma torch to vaporise a solid carbon feedstock (coal or graphite) with an operating temperature of about 10000K. Finally, a group of inventions including EP 2743231 A1, US 2005/0163696 A1, WO 03/095362 A2 and WO 2004/046030 A1 create a plasma torch independently and inject the carbon feedstock into the plasma flame in order to decompose it.

SUMMARY OF THE INVENTION

According to a first aspect of the present invention there is provided apparatus as defined in claim 1 of the appended claims, for plasma synthesis of CNTs. Thus, there is provided apparatus for plasma synthesis of CNTs, comprising: a plasma nozzle coupled to a reaction tube or chamber; means for supplying a process gas to the plasma nozzle, the process gas comprising a carbon-containing species; means for supplying radio frequency radiation to the process gas within the plasma nozzle, so as to sustain a plasma within the nozzle in use, and thereby cause cracking of the carbon-containing species; and means for providing a catalyst; wherein the plasma nozzle is arranged such that an afterglow of the plasma extends into the reaction tube/chamber, the cracked carbon-containing species also pass into the reaction tube/chamber, and the cracked carbon-containing species recombine within the afterglow, so as to form CNTs in the presence of the catalyst.

As those skilled in the art will appreciate, the expression "radio frequency radiation" encompasses the full extent of microwave frequencies, together with a range of non-microwave frequencies.

By virtue of the arrangement of the plasma nozzle such that, in use, an afterglow of the plasma extends into the reaction tube/chamber, the cracked carbon-containing species also pass into the reaction tube/chamber, and the cracked carbon-containing species recombine within the afterglow, this enables CNTs to be produced on a large scale, in some cases in a substrate-free manner.

Optional features are set out in the dependent claims.

The plasma nozzle may be shaped and configured so as to cause, in use, at least one vortex to be formed in the process gas within the plasma nozzle, said vortex being subjected to said radio frequency radiation.

Preferably the plasma nozzle is shaped and configured so as to cause, in use, multiple concentric vortices to be formed in the process gas within the plasma nozzle, said multiple vortices being subjected to said radio frequency radiation. The use of multiple vortices in this manner increases the time for which the process gas is exposed to the radiation, thereby increasing the efficiency of the plasma cracking process. It also allows better plasma stability by generating an area of lower pressure inside a third vortex where the plasma is more confined.

In a presently-preferred embodiment, for example, three concentric vortices are formed within the plasma nozzle.

The plasma nozzle may comprise: one or more inlets to receive a stream of the process gas, that forms a first vortex in use; an open end in communication with the reaction tube/chamber; and a vortex-reflecting end opposite the open end; wherein the nozzle is internally tapered towards the open end; such that, in use, a second vortex is created by the vortex-reflecting end, and a third vortex is produced by reflection of the second vortex from the vortex-reflecting end. Advantageously, the second vortex is created by the vortex-reflecting end which "sucks" the first vortex (by virtue of the Coanda effect) and then reflects it to form the third vortex.

The means for supplying radio frequency radiation may comprise a microwave generator (e.g. operating at 2.45 GHz, although other frequencies are also usable). A waveguide may be arranged to direct the microwave radiation to the nozzle, e.g. to coincide with the vortex(es) of the process gas.

In presently-preferred embodiments the reaction tube/chamber is cylindrical with curved side walls and an opening for the CNTs to exit through.

Preferably the reaction tube/chamber has a sufficiently large diameter so as to cause the afterglow to rapidly lose heat on exiting the nozzle.

Alternatively, or in addition, the reaction tube/chamber may incorporate means for cooling the afterglow on exiting the nozzle, such as (but not limited to) water cooling or gas cooling (e.g. to blow cold gas).

Alternatively, or in addition, the surface area of the reaction tube/chamber may be configured so as to cause cooling of the afterglow on exiting the nozzle, for example by providing an increased surface area (e.g. by incorporating fins or a structure similar to that of the bellows of an accordion).

Advantageously, the plasma is preferably generated at substantially atmospheric pressure, thereby facilitating operation.

The carbon-containing species may comprise any suitable gaseous hydrocarbon(s), liquid hydrocarbon(s), or liquefied hydrocarbon(s), with a carrier gas if necessary. For example, the carbon-containing species may comprise natural gas, which advantageously is readily available and relatively inexpensive, or any other suitable species such as one or more of $CH_4$, $C_2H_6$, $C_2H_4$, $C_3H_8$ or $C_4H_{10}$, toluene, ethanol, or other hydrocarbons as those skilled in the art will appreciate.

The means for providing a catalyst may comprise means for providing a catalyst precursor. The catalyst precursor may be solid, liquid or gaseous. Often metallocenes (ferrocene, cobaltocene, nickelocene) serve this purpose, but others, such as nitrates, nitrides and carbonyls, are also possible. Even pristine metal can be fed to the reaction, for example in the form of a metal wire that is progressively fed into the afterglow. It should be noted that, with the plasma system of the present work, the plasma process is very efficient in cracking the carbon-containing species (for example methane is cracked with an efficiency of greater than 99%), so the catalyst can be used as template only.

In presently-preferred embodiments the process gas further comprises a buffer gas, such as argon, nitrogen or helium, or one or more other suitable gases as those skilled in the art will appreciate.

Preferably the ratio of carbon-containing species to buffer gas in the process gas is 50:50 or less. Particularly preferably the ratio of carbon-containing species to buffer gas in the process gas is around 20:80 or less. Indeed, in the present work many ratios have been tested, and it has been found that, for higher grades of product, generally at least 4-6 times more buffer gas than carbon-containing species is preferable.

The process gas may alternatively comprise $CO_2$ or CO, with $CO_2$ serving more as a co-reactant than a buffer gas.

Alternatively, $CO_2$ may be used as the buffer gas.

Preferably, in use, the afterglow (or reaction zone) within the reaction tube/chamber has an operating temperature lower than 3500° C. More preferably, in use, the afterglow (or reaction zone) within the reaction tube/chamber has an operating temperature lower than 2000° C. For instance, the operating temperature of the afterglow (or reaction zone) within the reaction chamber can be around 1000° C.

In order to minimise the build-up of carbon along the inner wall of the reaction chamber, the chord central angle of the interface of the nozzle with the reaction tube/chamber is preferably greater than 0°. Particularly preferably said angle is between 50° and 180. Most preferably said angle is between 150° and 170°.

A plurality of plasma nozzles may be coupled to the reaction tube/chamber. In such a case, in order to minimise the build-up of carbon along the inner wall of the reaction tube/chamber, the chord central angle of the interface of each nozzle with the reaction chamber is preferably between 0° and 180°. Particularly preferably said angle is between 50° and 170°. Most preferably said angle is between 70° and 160°.

The apparatus may further comprise means for delivering gas around the interface between the or each nozzle and the reaction tube/chamber, so as to maintain sufficient gas flow to minimise carbon deposition.

In one embodiment the gas is directed towards the nozzle exit along the wall of the nozzle—reaction tube/chamber interface.

In another embodiment the gas is directed from the nozzle along the walls of the nozzle—reaction tube/chamber interface, towards the void of the reaction tube/chamber.

The apparatus may further comprise means for removing CNTs from the walls of the reaction tube/chamber, such as one or more mechanical scrapers or blowing gas, for example.

The apparatus may further comprise filtering means coupled to the reaction tube/chamber, for collecting the CNTs.

The means for providing a catalyst may comprise means for injecting or inserting a catalyst precursor into the afterglow, the catalyst precursor providing the said catalyst in use. For example, an injector tube may be used, into which the catalyst precursor is injected in a carrier gas and transported into the afterglow. If desired, such a tube may be heated uniformly or gradually, to tune cracking or agglomeration of the catalyst particles. Alternatively, catalyst wire may be fed directly into the afterglow. Advantageously, by injecting or inserting the catalyst precursor into the plasma afterglow, the carbon-containing species may be cracked independently of the catalyst. Contrary to traditional CVD systems in which both catalyst precursor and carbon-containing species are heated at the same time, independent cracking of the carbon-containing species and the catalyst enables CNTs of well-controlled diameter to be made.

Alternatively, the means for providing a catalyst may comprise means for injecting a catalyst precursor into the process gas that is supplied to the plasma nozzle, the catalyst precursor providing the said catalyst in use.

In a yet further alternative, the means for providing a catalyst may comprise a substrate that is at least partially coated or soaked with a catalyst precursor, the catalyst precursor providing the said catalyst in use. In one variant the substrate may be stationary, once placed inside the reaction tube/chamber. In another variant the substrate may be in the form of elongate material (e.g. a fabric ribbon) that is arranged to be fed, incrementally or substantially continuously, through the reaction tube/chamber, orthogonally to the reaction gas stream, for example in a roll-to-roll fashion. The positioning and tailoring of where (in terms of temperature) the catalyst-impregnated substrate is passed through the stream of reactive species may have an influence on the type of CNT morphology grown.

According to a second aspect of the invention there is provided a method of synthesising CNTs, the method comprising: coupling a plasma nozzle to a reaction tube or chamber; supplying a process gas to the plasma nozzle, the process gas comprising a carbon-containing species; supplying radio frequency radiation to the process gas within the plasma nozzle, so as to sustain a plasma within the nozzle, and thereby cause cracking of the carbon-containing species; and providing a catalyst; wherein the plasma nozzle is arranged such that an afterglow of the plasma extends into the reaction tube/chamber, the cracked carbon-containing species also pass into the reaction tube/chamber, and the cracked carbon-containing species recombine within the afterglow, so as to form CNTs in the presence of the catalyst.

Optional or preferable features relating to the second aspect of the invention correspond to the optional or preferable features mentioned above in respect to the first aspect of the invention.

At least one vortex may be formed in the process gas within the plasma nozzle, said vortex being subjected to said radio frequency radiation.

Preferably multiple vortices (e.g. three concentric vortices) are formed in the process gas within the plasma nozzle, said multiple vortices being subjected to said radio frequency radiation.

The radio frequency radiation may be microwave radiation. The method may further comprise directing the radiation to the vortex(es) of the process gas, e.g. using one or more waveguides.

Preferably the reaction tube/chamber has a sufficiently large diameter so as to cause the afterglow to rapidly lose heat on exiting the nozzle.

Alternatively, or in addition, the method may further comprise applying means such as water cooling or gas cooling such as to cool the afterglow on exiting the nozzle.

In a presently-preferred embodiment the method further comprises generating the plasma at substantially atmospheric pressure.

Advantageously and preferably, the process gas is cracked without being introduced into a thermal zone.

Preferably the afterglow (or reaction zone) within the reaction tube/chamber has an operating temperature lower than 3500° C. More preferably the afterglow (or reaction zone) within the reaction tube/chamber has an operating temperature lower than 2000° C. For instance, the operating temperature of the afterglow (or reaction zone) within the reaction chamber can be around 1000° C.

A plurality of plasma nozzles may be coupled to the reaction tube/chamber.

The method may further comprise delivering gas around the interface between the or each nozzle and the reaction tube/chamber, so as to maintain sufficient gas flow to minimise carbon deposition.

In one embodiment the gas is directed towards the nozzle exit along the wall of the nozzle—reaction tube/chamber interface.

In another embodiment the gas is directed from the nozzle along the walls of the nozzle—reaction tube/chamber interface, towards the void of the reaction chamber.

The method may further comprise a filtering process in which the CNTs are collected. As part of this, the method may further comprise blowing gas to dislodge agglomerates of CNTs which may form during the filtering process.

Advantageously, providing a catalyst may comprise injecting or inserting a catalyst precursor into the afterglow, the catalyst precursor providing the said catalyst. By injecting or inserting the catalyst precursor into the plasma afterglow, the carbon-containing species may be cracked independently of the catalyst, enabling CNTs of well-controlled diameter to be made. The catalyst precursor may be heated prior to its injection or insertion into the afterglow, to tune cracking or agglomeration of the catalyst particles.

Alternatively, providing a catalyst may comprise injecting a catalyst precursor into the process gas that is supplied to the plasma nozzle, the catalyst precursor providing the said catalyst.

In a yet further alternative, providing a catalyst may comprise providing a substrate that is at least partially coated or soaked with a catalyst precursor, the catalyst precursor providing the said catalyst. For example, the substrate may be in the form of elongate material (e.g. a fabric ribbon), and the method may further comprise pulling the elongate material through the reaction tube/chamber in an incremental or a substantially continuous manner.

Advantageously, the method may further comprise extracting the CNTs using a continuous extraction process.

BRIEF DESCRIPTION OF THE DRAWINGS

Embodiments of the invention will now be described, by way of example only, and with reference to the drawings in which.

DETAILED DESCRIPTION OF PREFERRED EMBODIMENTS

The present embodiments represent the best ways known to the applicants of putting the invention into practice. However, they are not the only ways in which this can be achieved.

Initial Summary

The present work provides a method and apparatus for large scale and continuous production of high quality CNTs. Embodiments of the method and apparatus are designed to achieve the following objectives:
1. Production of CNTs at a very large scale, suitable for commercial and industrial requirements.
2. High quality of CNTs, namely samples with a narrow distribution of the nanotube content.
3. Controllability over the CNT material in terms of diameter.
4. Simplicity of production through low power consumption and the use of readily available carbon feedstock, including widely available gases such as methane and carbon dioxide.

A modified microwave plasma nozzle (WO 2012/147054 A1) is attached to a modified afterglow chamber (WO 2010/094972 A1 and WO 2010/094969 A1), together with means for providing a catalyst, to rapidly produce a continuous stream of CNTs from the gas phase.

It is to be emphasised that references herein to a "chamber" (e.g. as in "reaction chamber" or "afterglow chamber") should be interpreted broadly, to encompass a tube or other suitable vessel in which CNTs can be synthesised. The primary purpose of the reaction chamber/tube is to contain the reaction gas stream and to enable the CNTs to form in the plasma afterglow; the specific geometry and orientation (e.g. vertical or horizontal) of the chamber/tube is not particularly important.

A filter system, such as, for example, a hot gas filtration system, may be attached to one end of the afterglow chamber, to continuously separate the solid carbon product from the process gases.

Although the presently-preferred embodiments use microwave radiation (of frequencies of the order of 300 MHz or greater) to produce a plasma to crack the carbon-containing species within the carbon feedstock, in alternative embodiments radio frequency radiation outside the microwave range may be employed.

CNT Production Apparatus—Overview

Figure 1:
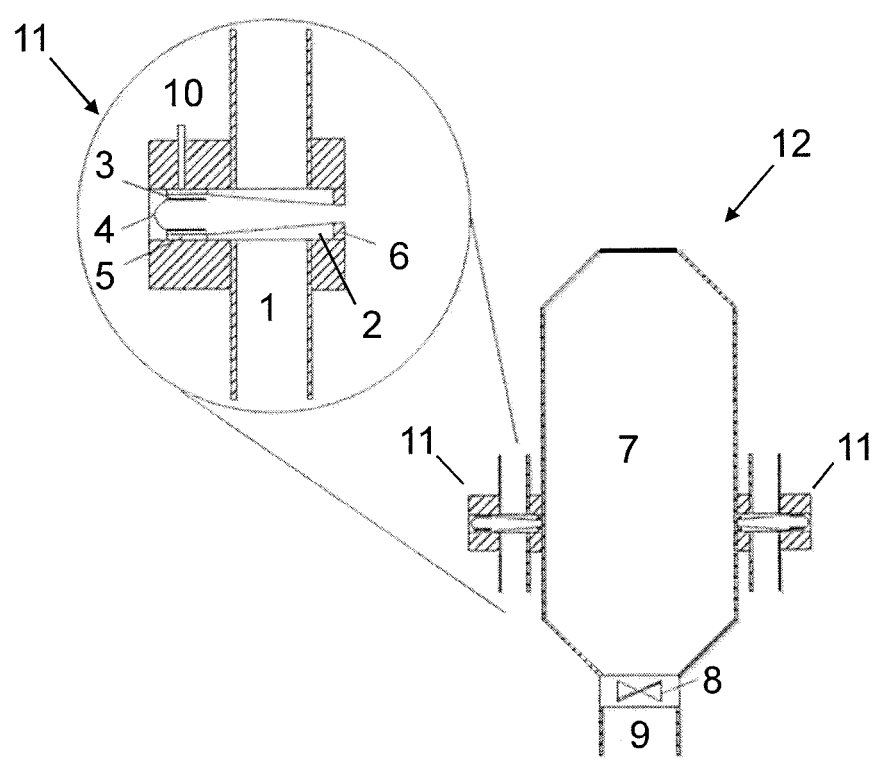
FIG. 1 illustrates an embodiment of the present invention, including a plasma nozzle and afterglow reaction chamber, for the plasma synthesis of CNTs.

FIG. 1 illustrates a presently-preferred embodiment of a CNT production apparatus 12 provided by the present work. The plasma system according to this embodiment consists of a microwave generator (2.45 GHz), a waveguide 1 and an atmospheric pressure plasma nozzle 11, a cylindrical plasma afterglow reaction chamber 7, and a filter system. Generators with lower frequencies have also been tested, including microwave generators at 896 MHz.

The process gas (comprising a carbon-containing species and a buffer gas) is passed through a dielectric tube 2 within the plasma nozzle 11, which bisects the microwave field within the waveguide 1. Inside the plasma nozzle 11, the gas forms several vortices due to the design of the nozzle, resulting in an extended exposure to the microwave field and generates a stable non-equilibrium plasma close to atmospheric pressure. For the sake of completeness, we note here that the plasma is not technically at atmospheric pressure since it is formed at the core of a vortex. Thus, its pressure is likely to be lower than atmospheric (pressure at the injection point). However, there is no further system used to decrease the pressure of the system other than the fluid mechanics induced by the described design.

The carbon-containing species within the process gas is cracked within the plasma. Methane, for instance, is cracked into carbon and hydrogen.

The afterglow of the plasma extends from within the nozzle 11 to within the adjoining reaction chamber 7. The cracked process gas also passes into the afterglow reaction chamber 7.

Within the plasma afterglow (within both the nozzle 11 and the reaction chamber 7, and as indicated by lengths L and E in FIG. 2 as discussed below), the cracked carbon-containing species of the process gas cools and solidifies to form CNTs of very high purity (>99.5%). The design and conditions within the afterglow reaction chamber 7 allow the control of the exact carbon morphology which results in the production of the CNTs.

The solid carbon products then pass through a filter medium designed to withstand high temperatures and collect on a suitable surface, or in a suitable receptacle. For example, the products may collect on the surface of filter candles suspended within a filter housing, or inside a filter medium designed in the shape of a basket. The filter medium is specified to allow the transmission of gases and vapourised liquids, but to capture the CNTs. High temperature operation ensures that potential by-products will stay in the gas phase and do not precipitate as impurities in the CNT product. The waste process gas, together with potential by-products, is transported from the filter to an oxidation unit to destroy any harmful by-products produced during the CNT synthesis process.

CNT Production Apparatus—in More Detail

As mentioned above, FIG. 1 illustrates a presently-preferred embodiment of a CNT production apparatus 12, including one or more plasma nozzles 11 and a reaction chamber 7. The process gas (comprising a carbon-containing species and a buffer gas) enters the nozzle 11 via inlet 10, through gas injection air knives 5 which cause the formation of a vortex stream spiralling down the tube. The empty space 4 at the back of the nozzle causes the creation of a second vortex by virtue of the Coanda effect, and a third vortex by reflexion in the opposite direction. This way, the gas stream has a longer residency time in the microwave which is channelled through the waveguide 1, ensuring better plasma stability. The three layers of vortex provide a greater thermal barrier which protects the inner walls of the nozzle from the hot plasma. Producing a vortex within a vortex within a vortex enables the production of a central vortex that is relatively small in diameter. This results in a very high rotational velocity, which subsequently creates a lower pressure zone in the centre of the vortex when compared to the same sized single vortex nozzle. Because plasma cracking efficiency is largely affected by the loss of energy from inelastic collisions between electrons and larger ions, the reduction in pressure increases the mean free path of the electrons, therefore resulting in fewer collisions. Creating a narrow vortex in this particular way also has the beneficial effect of creating turbulence between the counter flowing vortices which results in the re-circulation of gases, further increasing the residence time within the nozzle and therefore increasing the chance of ionisation occurring. The ionised gas stream/afterglow exits the nozzle 11 through the nozzle insert 6 into the reaction chamber 7.

The solid CNT product is formed at the exit of the nozzle 11, in the afterglow of the plasma, and ejected into the reaction chamber 7. The CNT product is then collected using a filter medium, as mentioned above.

Figure 2:
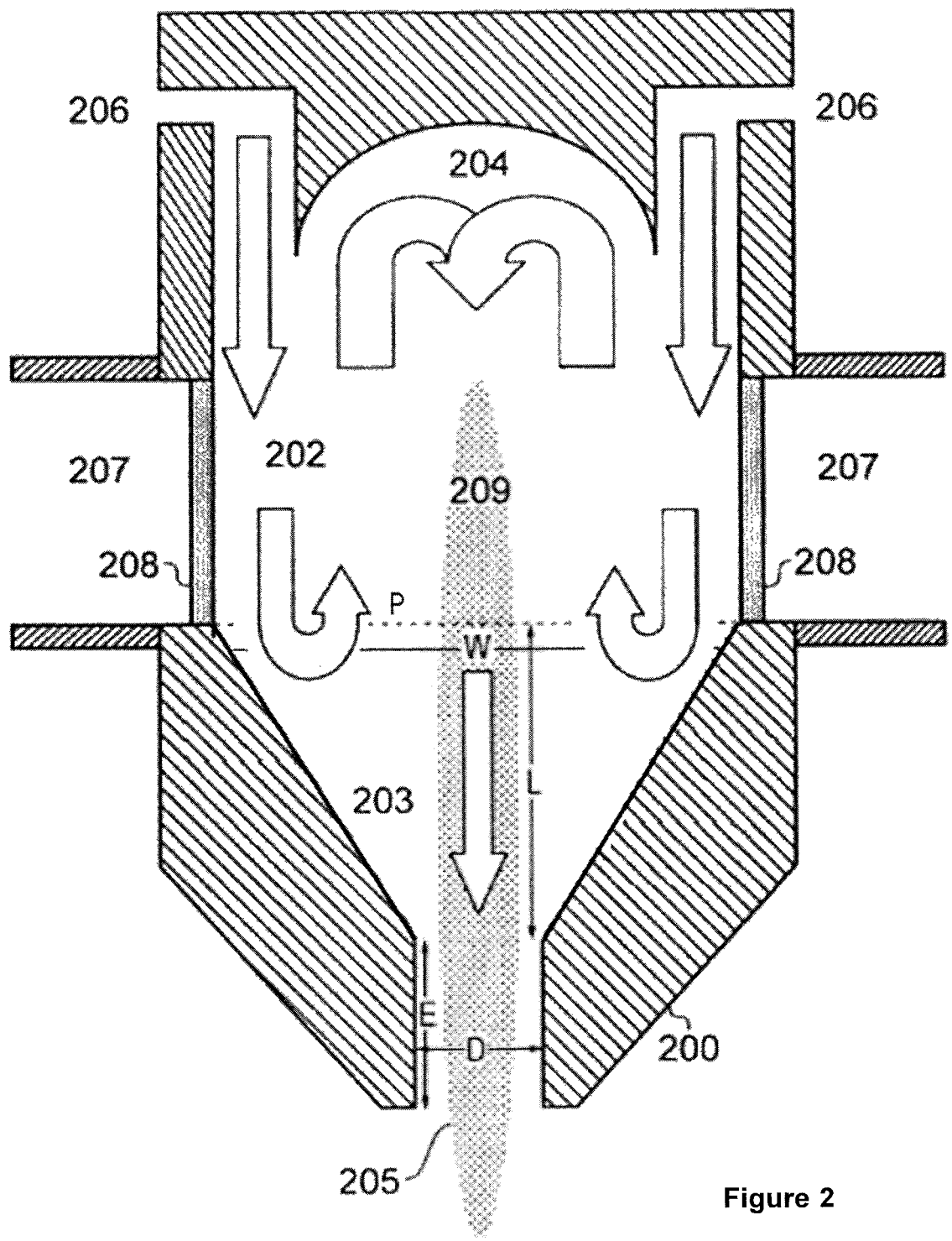
FIG. 2 is a simplified drawing of the plasma nozzle of FIG. 1.

Summary of Elements Shown in FIG. 1:
1 Waveguide
2 Dielectric tube
3 Vortex finder
4 Vortex reflector
5 Gas injection
6 Compression nozzle
7 Reaction chamber
8 Split butterfly valve
9 Carbon collection
10 Gas inlet
11 Plasma nozzle
12 Overall apparatus FIG. 2 is a simplified drawing of the nozzle (the nozzle 200 being shown rotated through 90° relative to the orientation of nozzle 11 in FIG. 1) and shows how the triple vortex is formed. Process gas enters through air knives 206, spirals down along the wall 202 and through a dielectric tube 208, where it is subjected to the microwave radiation exiting the waveguide 207. Along the taper 203, a counter vortex is created by the plasma finder 204 via the Coanda effect in the opposite direction on the inside of the first vortex, subjecting the gas stream to the microwave for the second time. The plasma finder 204 finally sends the gas back through the microwave for the third time. The plasma 209 is thus contained in the centre part of the nozzle, the outer two vortices protecting the tube from getting into contact with the plasma. Formation of the desired solid carbon species occurs along the entire length labelled L and E.

Figure 3:
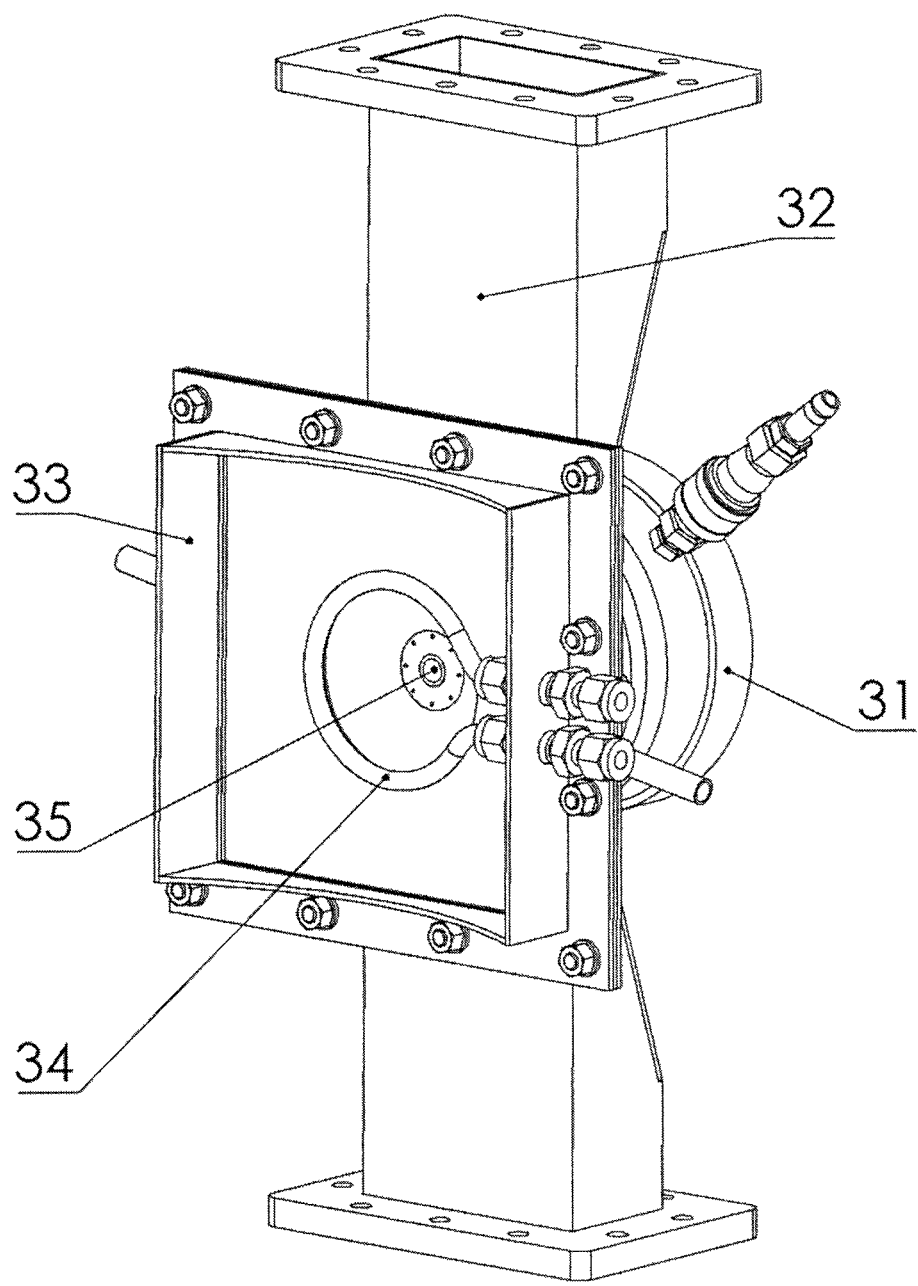
FIG. 3 illustrates the interface between the plasma nozzle, waveguide and reaction chamber with a purging ring.

FIG. 3 illustrates, in a perspective view, the interface between the plasma nozzle 31, the waveguide 32 and the reaction chamber 33, incorporating a purging ring 34. The gas flow exits from the outlet of the nozzle 35 and enters the reaction chamber 33 (where, in this case, only portions of the walls are shown). The purging ring 34 prevents carbon blockage at the outlet of the nozzle.

A presently-preferred embodiment of the invention is hitherto described and illustrated in FIG. 1. However, the invention is not limited to the exact specification described herein and a person skilled in the art will understand the concepts in use which could create other forms of the embodiment.

The presently-preferred method comprises the following steps:
Injecting the process gas (i.e. selected carbon feedstock gas and buffer gas) into a plasma nozzle.
Forming multiple vortices in the process gas within the plasma nozzle.
Passing the process gas through a microwave field in order to crack the feedstock gas.
Provision of a catalyst.
Passing the gas through a reaction chamber and forming the CNTs in the afterglow of the plasma as it exits the nozzle, in the presence of the catalyst.
Collecting the synthesised CNT material, e.g. in a hot gas filtration system.

Role and Choice of Process Gas Composition Buffer Gas and Temperature

The process gas comprises:
a carbon source such as, but not limited to, $CH_4$, $C_2H_6$, $C_2H_4$, $C_3H_8$ or $C_4H_{10}$; and
a buffer gas, usually inert—such as, but not limited to, $N_2$, Ar or He.

The carbon source is cracked in the plasma nozzle 11 (FIG. 1) and the resulting carbon species later recombines to form the CNTs in the reaction chamber 7.

$CO_2$ and $H_2$ can also be used to replace the buffer gas. However, these gases will also participate in the reaction. $CO_2$ will partially crack, where the oxygen radical can undergo side reactions with the developing CNTs to form undesired organic by-products. $H_2$ has an influence on the recombination of the carbon species with the hydrogen coming from natural gas cracking.

The buffer gas is used as a diluter to prevent too high density of carbon radicals while maintaining the plasma stable by providing enough gas to take the energy from the microwave field.

The buffer gas is also used to control the reaction temperature in the afterglow zone.

In our presently-preferred embodiments, natural gas is used as the feedstock gas and argon is used as the buffer gas. However, other feedstock gases and buffer gases may alternatively be used, as discussed elsewhere herein.

For CNT formation in the described plasma system, cracking of the hydrocarbon chosen as the carbon precursor (natural gas, or any of its components, liquids like oils, toluene, etc.) has to occur in the plasma nozzle and the right gas has to be chosen for dilution. Cracking of the carbon source would already occur in a standard plasma system widely used in research institutions, where gas is channelled into a simple ring through four concentric holes, creating a crude vortex spiralling down a quartz tube. The gas will be cracked when passing through the quartz tube and the microwave field. The cracking efficiency of methane in such a system is about 30% (methane to carbon conversion) at flow rates of not more than a few hundred millilitres per minute. The available power rating before burning the quartz is limited. Experiments can normally not exceed 15-20 minute runs. However, in the present work, improving the nozzle in terms of vortex creation and especially introduction of a double and triple stream through the nozzle, has allowed us to improve methane cracking to about 99%. Nozzle openings affect the shape (length and width) of the plasma torch and thereby define the point at which the CNTs form, as well as the heat dissipation at that point.

An important factor for harvesting high quality CNT material is the temperature at the carbon collection point. Heat dissipation immediately after CNT formation in the afterglow of the plasma is desirable in order to maintain good quality CNTs (as, once formed, the CNTs would deteriorate over time if constantly subjected to high temperature). This is achieved via a large diameter chamber (e.g. chamber 7 in FIG. 1) attached to the plasma nozzle 11. Expansion of the gas directly after the plasma nozzle allows for the necessary temperature decrease to avoid deterioration of the CNTs. The type and quality of the material will strongly depend on the carbon source, the inert gas used to dilute the carbon source and the power rating which is coupled with the temperature generated from the shape of the plasma and therefore the afterglow.

Excess methane, as the most stable component of the common carbon source natural gas, can also be used as the most effective dilutant of the produced solid carbon species. Agglomeration of the resulting CNTs is therefore prevented more efficiently and a fine powder of CNTs can be obtained. $CO_2$ has a similar effect.

Further Considerations in Respect of Plasma Temperature

Figure 19:
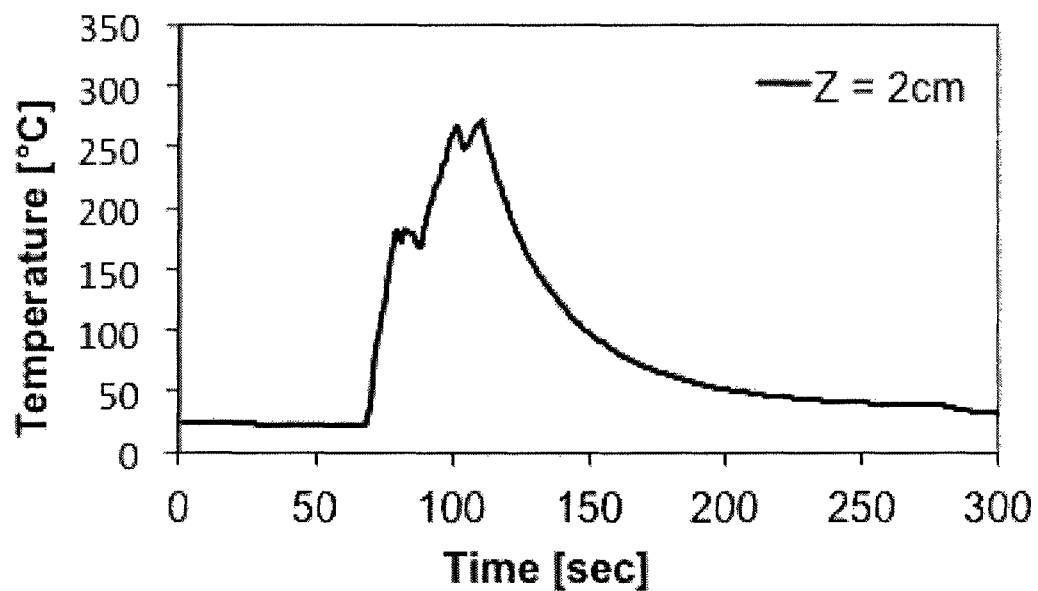
FIG. 19 shows an experimentally-measured temperature profile at a point 2 cm from the plasma zone during plasma ignition.
Figure 20:
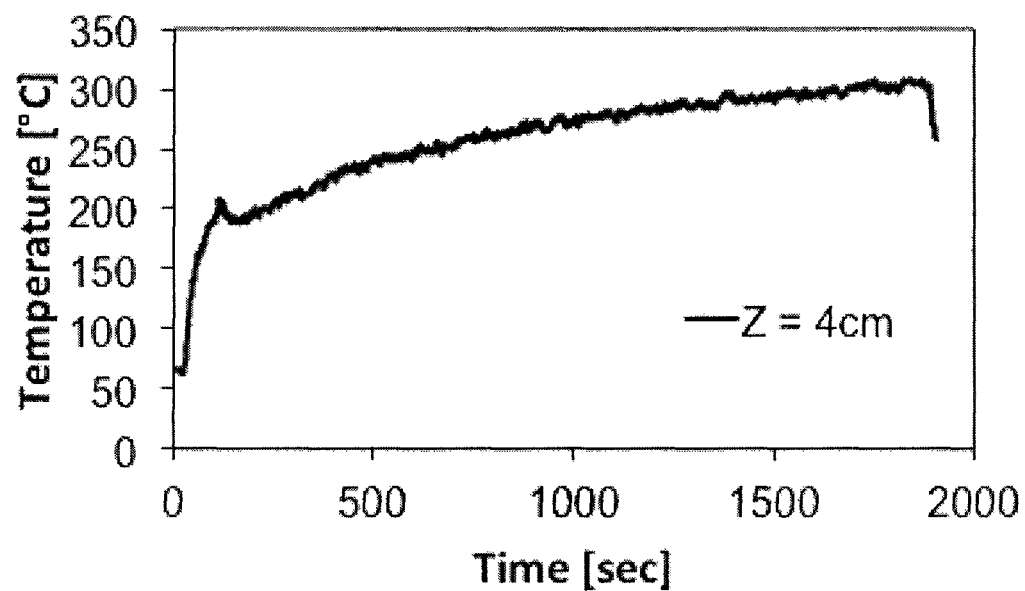
FIG. 20 shows an experimentally-measured temperature profile at a point 4 cm from the plasma zone during typical operation.
Figure 21:
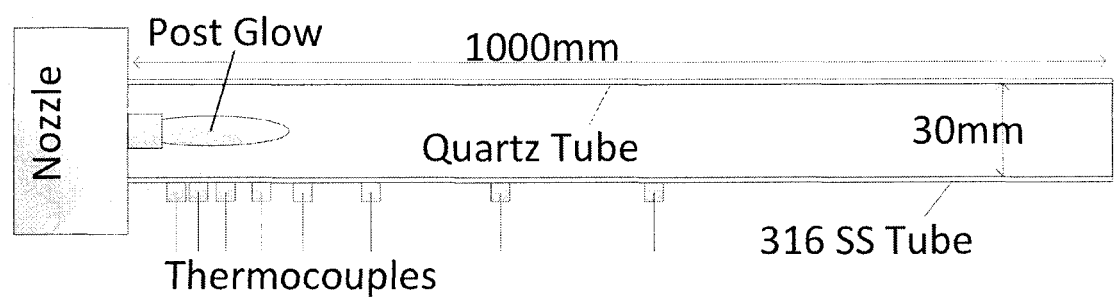
FIG. 21 shows a configuration of thermocouples in a reaction tube, as used to obtain the test results shown in FIGS. 19 and 20.

In our presently-preferred embodiments the plasma system using microwaves runs at a relatively low temperature, which is key in simplifying the process and facilitates scale-up. This is a significant advantage over thermal plasmas, which commonly operate at temperatures over 1000° C. In contrast, in the presently-preferred embodiments, the gas is cracked in the nozzle where the plasma forms. In microwave plasma, electron and ion temperatures differ. Temperature in the afterglow at the exit of the plasma is produced due to the recombination of ions in the afterglow, the ion-electron recombination process being an exothermic reaction. Tests we have carried out using a tube-shaped reaction vessel have shown that typical temperatures in the afterglow are around 150° C. immediately after plasma ignition, as shown in FIG. 19. Temperature will build up over time, as shown in FIG. 20, FIG. 21 shows the configuration of thermocouples used to measure the temperature in the reaction tube in these tests. Further operation conditions can bring the temperature up to around 1000° C.

Going into the test results shown in FIGS. 19 and 20 in more detail, FIG. 19 shows the measured temperature profile at a point 2 cm from the plasma zone during plasma ignition. The temperature is measured very close to the exit of the plasma nozzle, at the very beginning of the afterglow zone. The zone is initially at room temperature. The plasma is ignited after 70 s. The temperature increases over the next 10 s in the afterglow to reach about 150° C. Introduction of higher flows causes the temperature to increase up to 280° C. The plasma is then switched off after 120 s.

FIG. 20 shows the measured temperature profile at a point 4 cm from the plasma zone during typical operation. The temperature is measured over 1800 s. After ignition at 70 s, larger gas flow is introduced to start the CNT synthesis. Temperature in the afterglow will build up over time due to the confined space in the reaction chamber, reaching about 300° C. at the end of the run.

FIG. 21 shows the configuration of thermocouples in the reaction tube, as used to obtain the test results shown in FIGS. 19 and 20. A series of thermocouples are positioned along the afterglow (labelled "Post Glow" in FIG. 21), at the exit of the plasma nozzle. The temperature measurement points are along the axis of the plasma.

Role of Power

As a general rule, higher power of the plasma system gives better cracking efficiency and allows processing of higher flow rates. The route to scale up consists in adapting the nozzle design, optimising the process gas composition and reaction chamber design to a higher power.

Scaling and increasing the power of the plasma system can be achieved in two ways. It is either possible to combine several nozzles around a reaction chamber or increase the power of the microwave generator and design a larger nozzle. Most experiments have been run between 1 and 20 kW. However, there is no restriction of scale on the nozzle.

In a typical experiment at 6 kW, total gas flows (i.e. carbon source+buffer gas) around 25-45 L/min (litres per minute) are common. Experiments at 20 kW take place in a larger system. A larger waveguide enables utilisation of a larger nozzle which makes higher gas flows and therefore powers possible. Typical gas flows are between 70-130 L/min.

Plasma Nozzle (Method for Processing the Gas)

As described above, the process gas (carbon source+ buffer gas) is injected into a plasma nozzle 11 (FIG. 1). In the presently-preferred embodiments, the processing method using the plasma nozzle consists of:

Employing an elongated vessel with an inner space of conical symmetry which
 (i) at a first end has an exit opening located at the centre axis;
 (ii) is open at the second end opposite the first end; and
 (iii) is transparent to microwave energy in a section between the first and second ends.

Forming a first vortex flow of the gas that is to be processed running along the inner wall of the inner space of the vessel from a distance below the second end to the middle of the inner space of the vessel.

Forming a second vortex flow of gas that is to be processed running along the centre axis of the vessel from the middle of the inner space of the vessel towards the second exit of the vessel and along the wall of the vortex finder space.

Forming a third vortex flow of gas that is to be processed running along the centre axis of the vortex finder into the inner space of the vessel and out of the exit opening at the first end, and Forming a standing wave microwave aligned to form a wave crest at the centre axis of the vessel, in the area of the vessel where it is transparent to microwave energy, with sufficient intensity to excite at least a portion of the gas in the third vortex to form a microwave plasma.

The rotating ionised gas passes co-axially through the inner space of the dielectric tube and exits through the first end, through the compression nozzle, into the reaction chamber.

Use a gas purging ring to prevent carbon build-up at the nozzle exit (by purging and cooling).

Figure 4:
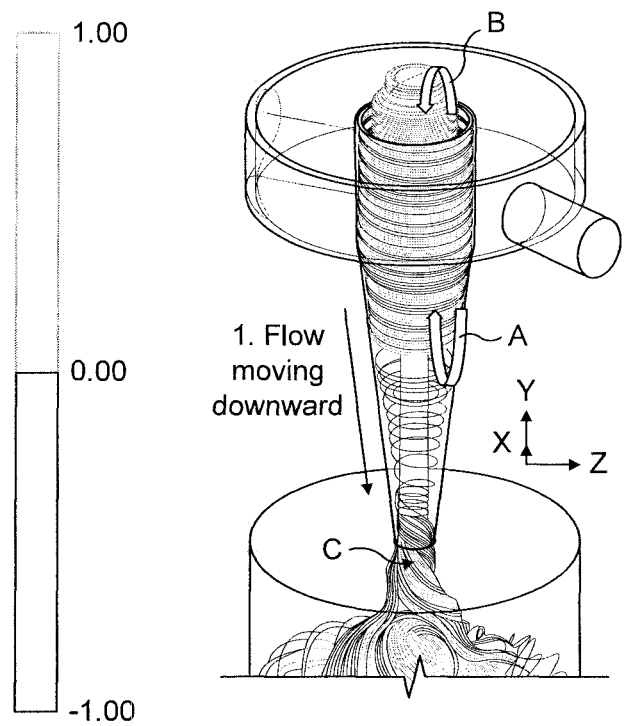
FIG. 4 shows a computational fluid dynamics (CFD) simulation showing a triple vortex structure.

FIG. 4 shows a computational fluid dynamics (CFD) simulation showing the triple vortex structure. The curved arrow A in the middle shows the formation of the first vortex from the gas inlet and the first counter vortex. The curved arrow B at the top shows the formation of the third vortex at the back of the nozzle. The arrow C points to the exit of the nozzle.

Reaction Chamber (Method for Controlling Plasma Recombination to Form CNTs)

The nozzle 11 (FIG. 1) may be coupled directly to the reaction chamber 7 so as to input ionised gas/plasma into the chamber at an angle to the chamber walls.

Preferably, the gas stream coming out of the nozzle 11 is tangential to the reaction chamber cylinder.

Preferably, the reaction chamber 7 has a much larger volume than the nozzle 11 such that the gas stream coming out of the nozzle can expand, thereby diluting the gas stream coming out of the nozzle.

Preferably, the reaction chamber 7 has curved side walls and may accommodate multiple plasma nozzle inlets around its circumference.

In the presently-preferred embodiments, the ionised gas passing into the inner space of the reaction chamber 7 will form a rotating flow along the inner wall and have an increased residence time in the afterglow environment.

The gaseous and fine solid materials will flow upwards within the reaction chamber 7. Sufficiently agglomerated carbon will pass down towards the opening 9 in the bottom wall of the reaction chamber 7.

A mechanical scraper may be coupled with the chamber 7 such as to mechanically remove large carbon aggregates from the walls of the chamber or the filter medium. A blowback system, acting on the filter medium, may alternatively or additionally be employed.

The reaction chamber design described herein builds upon the foundation of knowledge described in the previous general plasma reactor patent applications WO 2010/094972 A1 and WO 2010/094969 A1 In the present work, the reaction chamber 7 being spatially separate from the plasma source is of particular importance during the synthesis of high purity CNT materials.

It is an object of an embodiment of the present invention to provide a plasma device for facilitating the reaction within a reaction chamber and the subsequent growth of CNTs.

It is a further object of an embodiment of the present invention to provide a plasma device for the continuous production and removal of substantially uniform CNT products.

Accordingly, the presently-preferred embodiments of the invention provide a reaction vessel comprising a reaction chamber 7 coupled with one or more plasma nozzles 11 for directing a flow of material via the plasma generator to a respective inlet to the reaction chamber.

Preferably, the reaction chamber 7 is cylindrical with curved side walls. In the first instance, the plasma plumes/afterglows will extend out of the nozzle outlet into the reaction chamber 7 and extend to fill the void within the chamber. The ionised species generated by individual nozzles may combine to further improve the growth of CNTs and increase the efficiency of the conversion of gas to high value CNT products with improved characteristics. Reactant materials that flow around the chamber 7 will then have an increased residency time in an afterglow environment, as the afterglow from successive nozzles is encountered.

Another advantage provided by the flow conditions within the chamber is that the build-up of CNT material upon the side walls of the reaction vessel will be reduced.

Ideally, the CNTs generated in accordance with embodiments of the invention will pass through the inner space of the reaction chamber 7 and collect on the filter medium. In order to facilitate the continuous operation of the reaction chamber, several features are included to prevent or remove carbon build-up.

The tangential plane of the nozzle/reactor interface may be chosen in order to prevent the interference of material flow between nozzles (FIG. 1) and minimise the build-up of carbon along the inner wall of the reaction chamber 7. The flow profile should be additive in order to generate a vortex flow pattern within the cylindrical volume of the reaction chamber 7. The maximum tangential angle for a single nozzle should preferably be less than 80° such that the flow of material from the nozzle does not interfere with the wall of the reaction chamber 7. More preferably the tangential angle should be less than 50° but greater than 0°. Most preferably the tangential angle for a single nozzle coupled to the reaction chamber should be less than 40° but greater than 20°.

Figure 5:
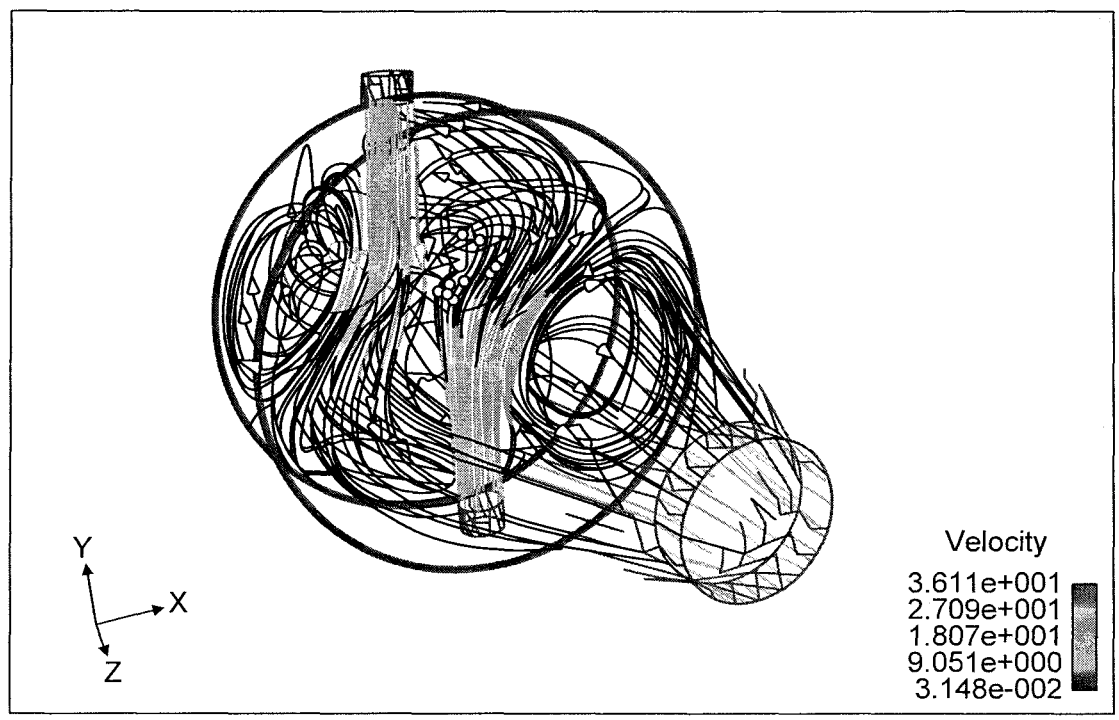
FIG. 5 illustrates a CFD model of a twin nozzle using offset tangent planes.

FIG. 5 illustrates a CFD model of a twin nozzle using offset tangent planes.

The tangential flow angle for two or more nozzles should preferably be less than 80° such that the flow of material from the nozzle does not interfere with the walls of the reaction chamber 7 and greater than 0° such that the flow does not interfere with the flow from the next nozzle. More preferably the tangential angle should be less than 50° and more than 10°. Most preferably the tangential angle should be less than 40° and greater than 20°.

Figure 18:
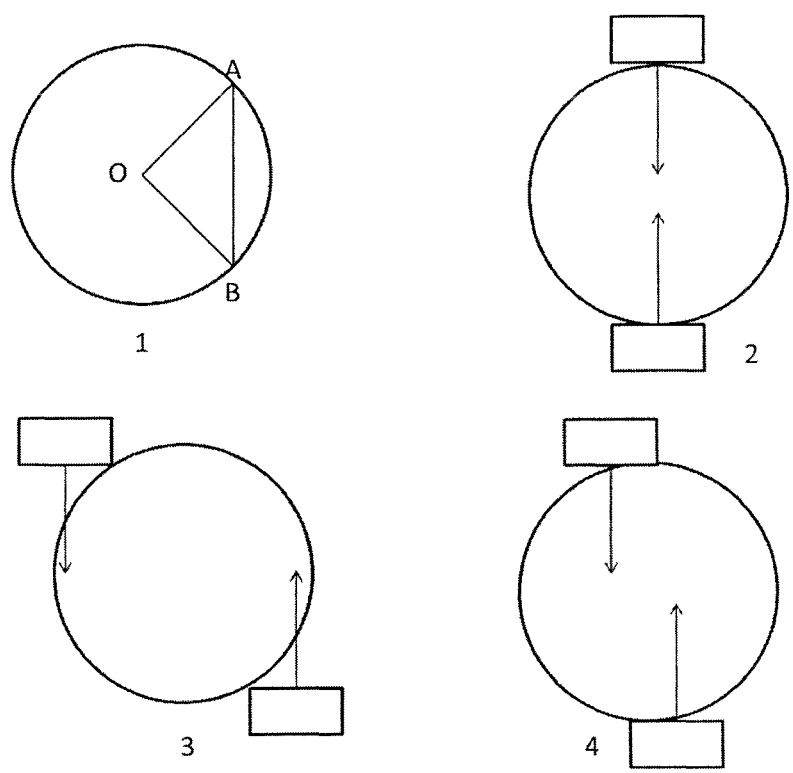
FIG. 18 is a series of schematic illustrations relating to the arrangement of plasma nozzles relative to a reaction chamber.

The arrangement of the plasma nozzle(s) relative to the reaction chamber may be better understood with reference to FIG. 18, which consists of a series of schematic illustrations (1)-(4), in each of which the circle represents a reaction chamber in cross-section, and the rectangles represent plasma nozzles. In (1), the chord AB has a chord central angle O, the chord being the direction the plasma bisects the circular chamber as it is ejected from the nozzle. With reference to (2), if the chord central angle is 180° then the plasma nozzles are directly opposite each other, which would be non-ideal as the plasmas produced would interfere with each other in the reaction chamber. With reference to (3), if the chord central angle is close to 0° then the plasma plume would enter the cylinder tangentially, which would also be non-ideal as there would be interference from the wall. So, as shown in (4), ideally the nozzles are angled away from the wall and away from each other.

The maximum chord central angle for a single nozzle should preferably be greater than 0° such that the flow of material from the nozzle does not interfere with the wall of the reaction chamber 7. More preferably the chord central angle should be less than 180° but greater than 50°. Most preferably the chord central angle for a single nozzle coupled to the reaction chamber should be less than 170° but greater than 150°.

The chord central angle for two or more nozzles should preferably be less than 0° such that the flow of material from the nozzle does not interfere with the walls of the reaction chamber 7 and greater than 180° such that the flow does not interfere with the flow from the next nozzle. More preferably the chord central angle should be less than 170° and more than 50°, Most preferably the chord central angle should be less than 160° and greater than 70°.

The plasma nozzle 11 should be coupled to the reaction vessel 7 in such a way as to minimise the distance from the centre point of the plasma volume within the plasma nozzle to the reaction vessel volume. An important aspect of the present work is that formation of the CNTs should not (as far as possible) occur within the plasma nozzle 11 itself. Thus placing the centre point of the plasma close to the reaction vessel 7 reduces the likelihood of carbon formation before it has reached the void of the chamber and does not deposit around the nozzle chamber interface.

The actual distance required to prevent carbon build-up is based upon a complex interplay between the gas composition, microwave power and nozzle set-up. So in general making the distance as short as is physically possible is chosen as the simplistic option.

A further aspect of the present work is the integration of a gas delivery system around the nozzle/reaction chamber interface for the purpose of maintaining sufficient gas flow to minimise carbon deposition. The increased cold gas flow also has the added benefit of cooling this particularly hot region for the prevention of carbon sintering. Reducing the surface temperature of nozzle components to below the sintering temperature of carbon (2000° C.) enables the production of a homogeneous carbon product in addition to the continuous operation of the system.

In one embodiment, a gas is directed towards the nozzle exit along the wall of the nozzle/reaction chamber interface. The gas flow has the effect of preventing the deposition of carbon along the wall of the interface and of reducing the temperature of the wall.

In another embodiment, the gas is directed from the nozzle along the walls of the nozzle chamber interface towards the void of the chamber. The gas may be injected with the use of the multiple small holes or a Coanda ring nozzle from a small pressurised chamber situated 360° around the circular nozzle exit.

Another aspect of the post nozzle gas injection system is the ability to further control the afterglow conditions through the type and flow rate of gas used. It provides the ability to apply gas that has not been processed by the plasma nozzle to the reaction zone.

Figure 6:
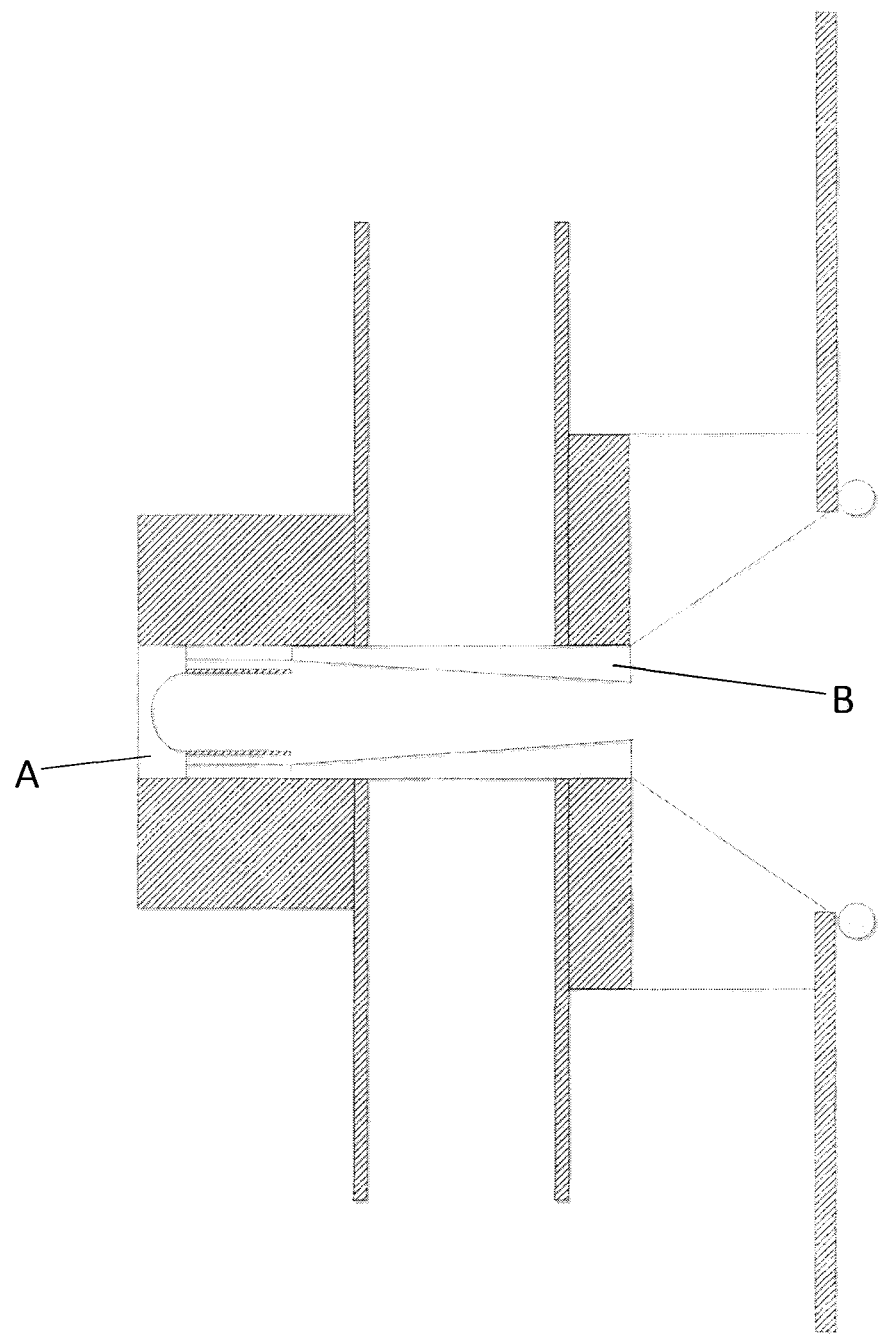
FIG. 6 illustrates a plasma nozzle, modified to prevent carbon build up by tapering the exit, with an additional channel to allow constant cooling via inert gas flow.

FIG. 6 illustrates a sectional view of the nozzle-chamber interface described in FIG. 3. The plasma finder or vortex-reflecting end is denoted by A and the elongated vessel transparent to microwave is denoted by B.

A further aspect of the present work which minimises the build-up of carbon upon the reactor wall is the inclusion of a mechanical scraper system for continually removing deposited carbon from the walls of the inner space of the reaction vessel.

In one embodiment, vertically aligned struts are placed concentrically around the cylindrical inner wall of the reaction vessel 7 and joined by a central column which can rotate up to 360°, The central strut can be rotated periodically to dislodge carbon build-up from the wall of the reaction chamber 7 in order to maintain both continuous operation and production of a substantially uniform CNT product.

In another embodiment, horizontally aligned cylindrical scrapers joined by a central column can move up and down the vertical axis of the reaction vessel 7. The vertical motion also acts to dislodge the CNT product. The build-up of carbon product can alter the thermal characteristics of the reaction vessel during continuous operation, negatively impacting the production of CNTs.

Providing the Catalyst

The formation of CNTs from reactive species (i.e., as produced by plasma cracking) is catalysed by the presence of transition metal clusters. These transition metal clusters may comprise, for example, iron, nickel or cobalt, but also Mo as well as Au, Ag and Cu or a combination of any of the above. Furthermore, non-metal catalysts are possible like e.g. $SiO_2$, $ZrO_2$ or a combination of these. A catalyst precursor may be used to provide the transition metal clusters. The catalyst precursor may comprise, for example, pristine metal, metal powder or organometallic complexes.

In the present work, the catalyst precursor can be injected, or otherwise provided, in three principal ways:

In a first way, a substrate, coated (or soaked) with catalyst precursor, can be placed in the reaction chamber 7, subsequent to the plasma nozzle 11. CNTs grow on the catalyst and are connected to the substrate. (Examples of CNTs produced in this manner in the present work are shown in the SEM images of FIGS. 12, 13, 14 and 15.)

In one variant the substrate (soaked or coated with the catalyst precursor) may be stationary, once placed inside the reaction chamber.

In another variant the substrate (soaked or coated with the catalyst precursor) may be in the form of elongate material (e.g. a fabric ribbon) that is arranged to be fed, incrementally or substantially continuously, through the reaction chamber, orthogonally to the reaction gas stream, for example in a spooled or roll-to-roll fashion. The positioning and tailoring (in terms of temperature) of where the catalyst-impregnated substrate passes through the stream of reactive species may have an influence on the type of CNT morphology grown.

Alternatively, in a second way, the catalyst precursor can be fed together with the hydrocarbon stream into the nozzle 11 and cracked in the plasma.

Figure 7:
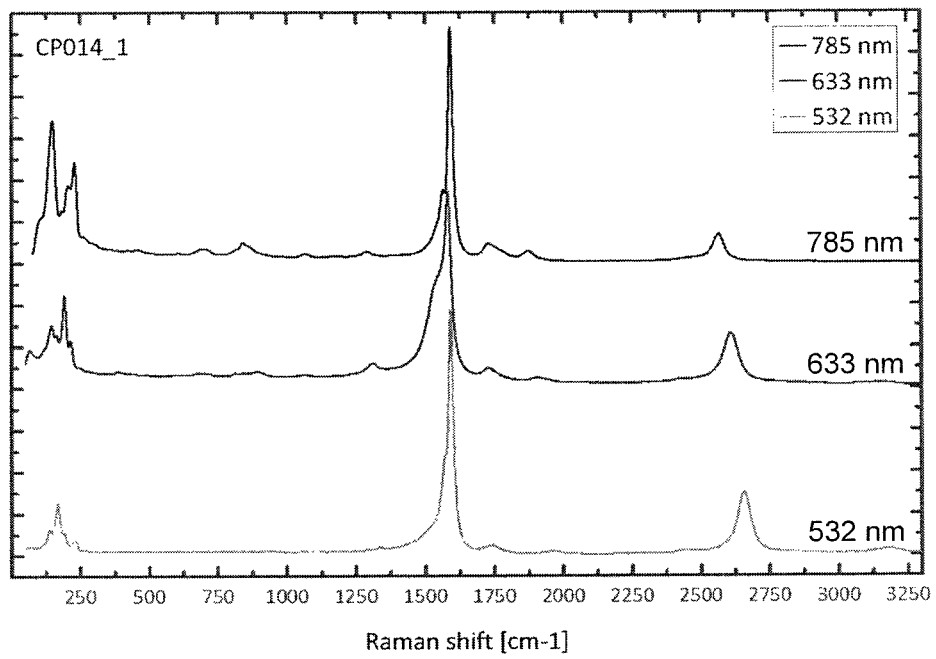
FIGS. 7 and 8 present Raman spectra of CNTs synthesised in accordance with the present work ("Examples 1 and 2", for which the catalyst precursor was injected directly into the plasma afterglow)
Figure 8:
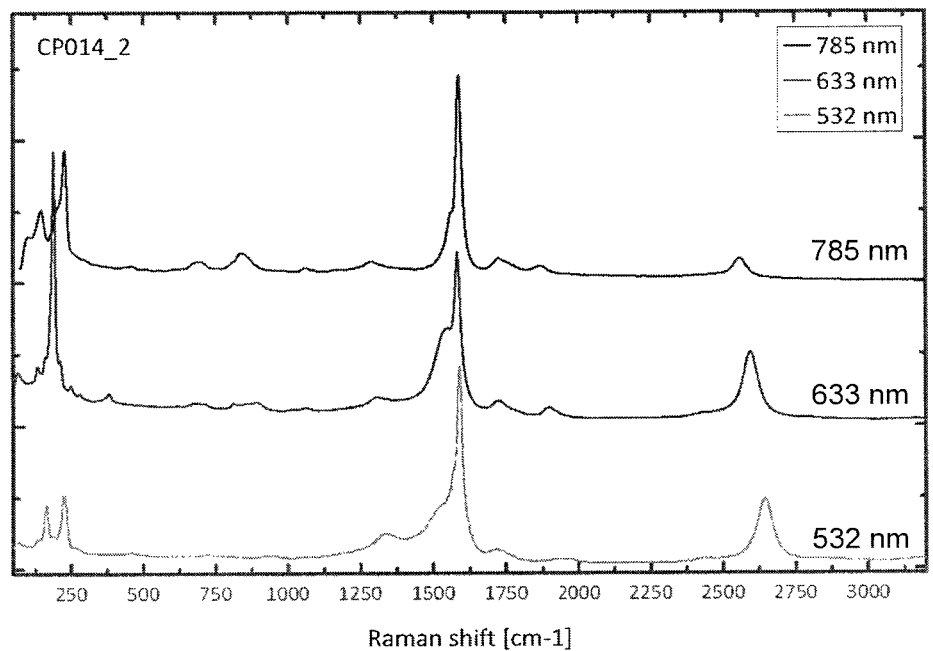
Figure 9:
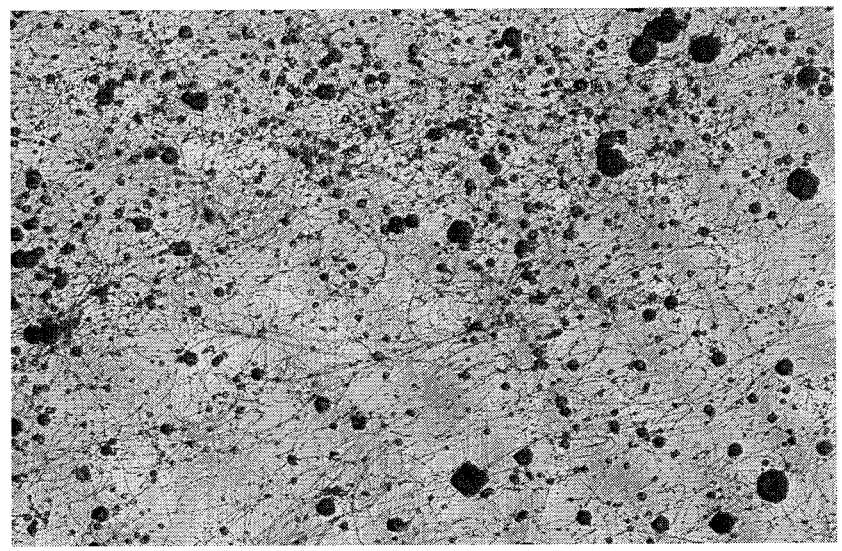
FIGS. 9, 10, 11 present transmission electron microscope (TEM) images of the CNTs of Example 1.
Figure 10:
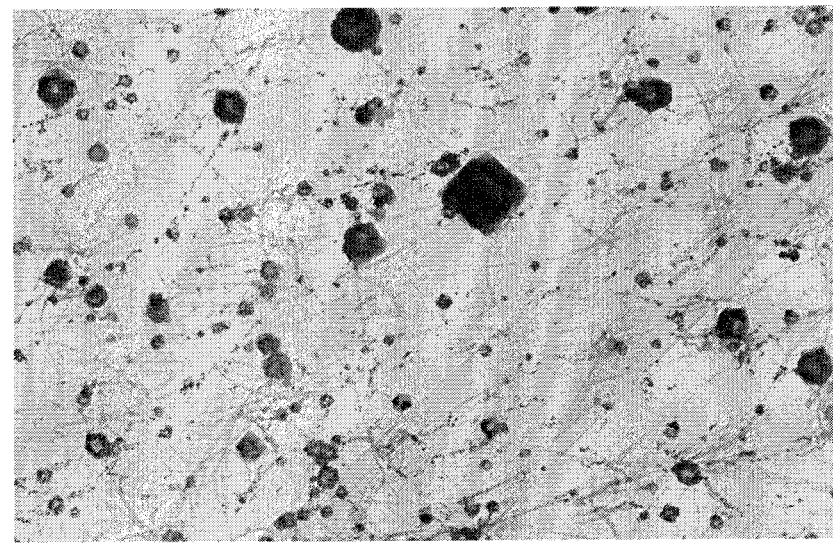
Figure 11:
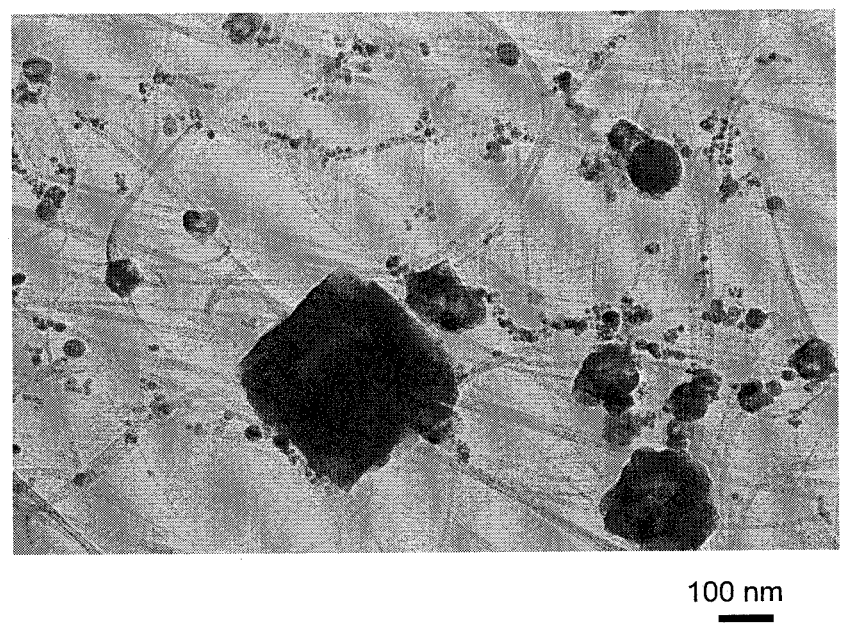
Figure 12:
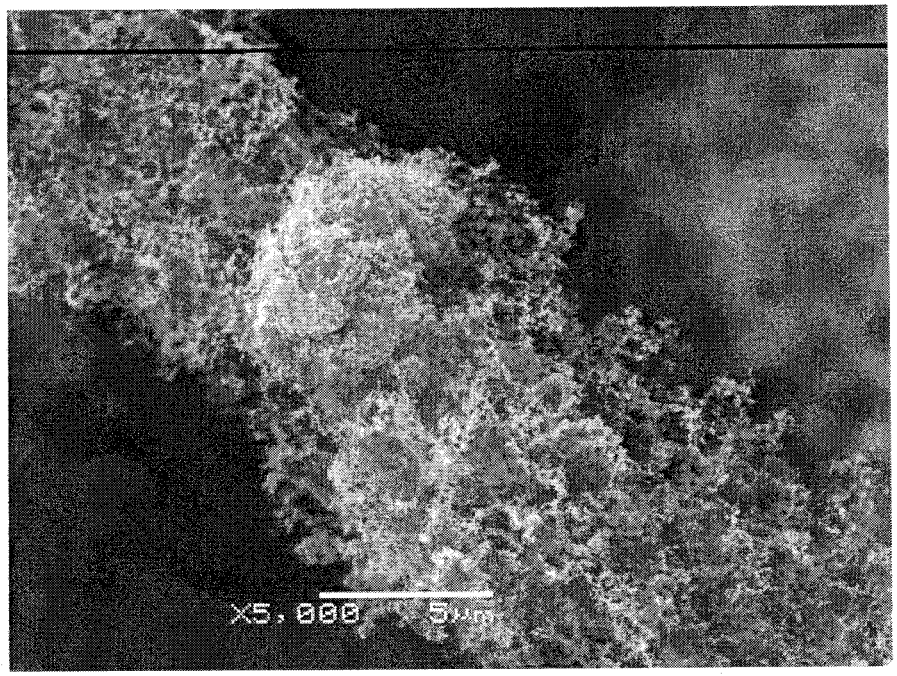
FIGS. 12, 13, 14 and 15 present scanning electron microscope (SEM) images of other CNTs synthesised in accordance with the present work (with these examples, the CNTs having been grown on catalyst-precursor-impregnated substrates)
Figure 13:
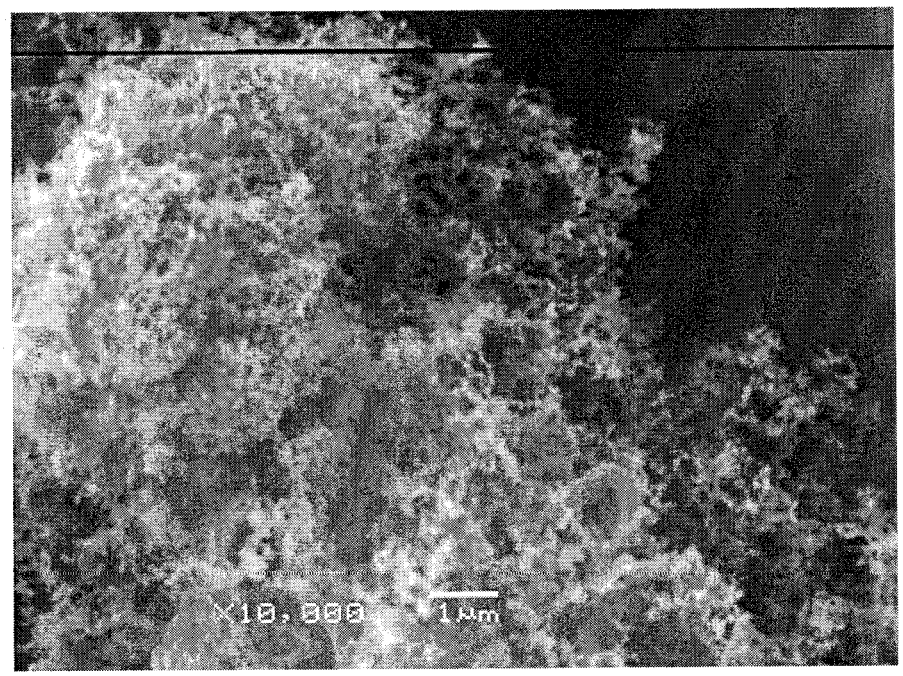
Figure 14:
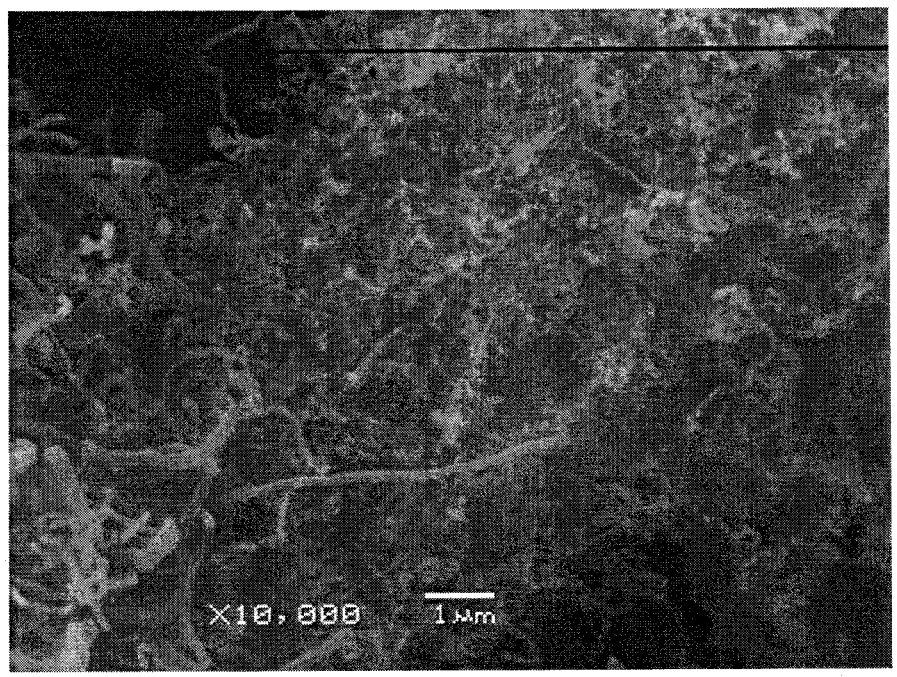
Figure 15:
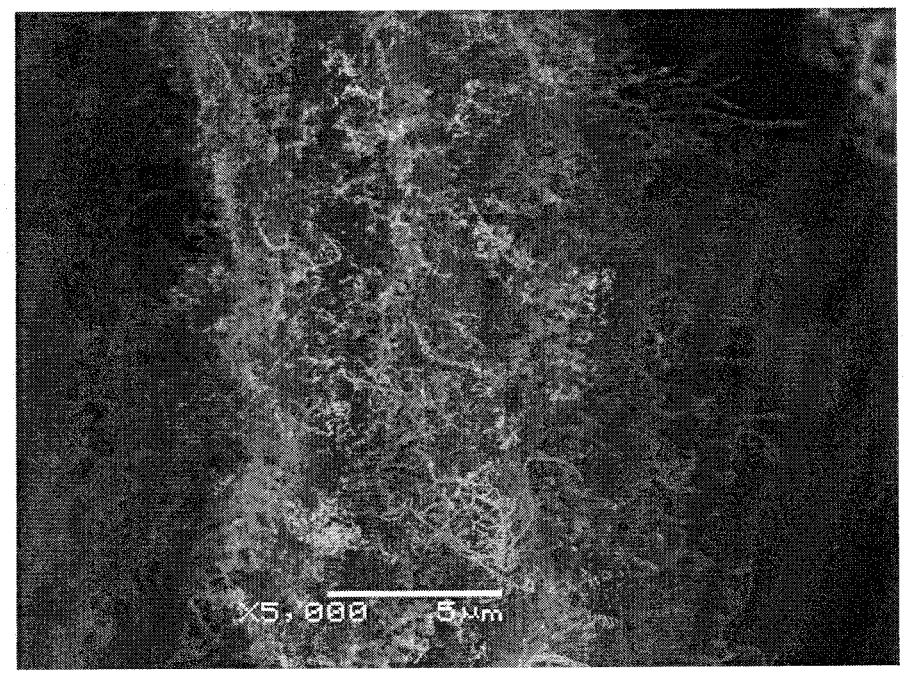

A third way is to inject the catalyst precursor into the plasma afterglow, (Examples of CNTs produced in this manner in the present work are characterised in the Raman spectra of FIGS. 7 and 8, and in the TEM images of FIGS. 9, 10 and 11.) Here, different configurations are possible. In one case, a simple tube, e.g. oriented orthogonal to the plasma axis, can be used, into which the catalyst precursor is injected in a carrier gas and transported into the afterglow. This tube can be heated uniformly or gradually, to tune cracking or agglomeration of the catalyst particles. Another option is to feed the catalyst precursor directly into the afterglow, for example through ring 34 as shown in FIG. 3.

An advantage of injecting the catalyst precursor into the plasma afterglow is that the carbon source (e.g. methane or other hydrocarbons) cracks independently of the catalyst. Contrary to traditional CVD systems where both catalyst precursor and carbon source are heated at the same time, the plasma system cracks the carbon source independently, which allows CNTs of well-controlled diameter to be made. Thus, in this system:

The carbon source is cracked in the plasma nozzle, offering species ready for reaction in the plasma afterglow where the catalyst is later injected.

The size of the catalyst particles determine the size of the CNTs which grow on them, and can be controlled simply by adjusting the concentration and residency time of the catalyst precursor in the catalyst heating chamber.

In the plasma afterglow, the reactive species are put into contact with the formed catalyst particles of the required size, to start continuous CNT growth.

EXAMPLES AND CHARACTERISATION

Examples 1 and 2

We produced quantities of CNTs in accordance with the present work, by direct injection of the catalyst precursor into the plasma afterglow. The synthesis conditions were as follows:

Example 1

Natural gas was injected into the plasma nozzle at a level of 2 L/min together with hydrogen as a dilution gas at a level of 25 L/min, which results in a natural gas/hydrogen weight ratio in the feedstock of 100. Cracking of the hydrocarbon source at this dilution level leads to CNT formation. CNTs were collected in a filter at the end of a 1.5 m long reaction tube attached to the plasma nozzle.

Example 2

Natural gas was injected into the plasma nozzle at a level of 5 L/min together with hydrogen as a dilution gas at a level of 25 L/min, which results in a natural gas/hydrogen weight ratio in the feedstock of 250. Cracking of the hydrocarbon source at this more concentrated level leads to CNT formation. CNTs were collected in a filter at the end of a 1.5 m long reaction tube attached to the plasma nozzle.

FIG. 7 presents Raman spectra of the CNTs of Example 1, and FIG. 8 presents Raman spectra of the CNTs of Example 2.

The relative intensity data of the peaks of the spectra in FIG. 7 are as follows:

| Infrared (785 nm) | | Red (633 nm) | | Green (532 nm) | |
| --- | --- | --- | --- | --- | --- |
| Raman shift (cm$^{-1}$) | Relative intensity | Raman shift (cm$^{-1}$) | Relative intensity | Raman shift (cm$^{-1}$) | Relative intensity |
| 149 | 0.604 | 64.5 | 0.197 | 139.5 | 0.106 |
| 182.5 | 0.225 | 145.5 | 0.321 | 167.5 | 0.213 |
| 205.5 | 0.329 | 192 | 0.476 | 188 | 0.096 |
| 228.5 | 0.430 | 215 | 0.248 | 1338 | 0.033 |
| 1298.2 | 0.047 | 1310.5 | 0.128 | 1591 | 1 |
| 1564.5 | 0.311 | 1581.5 | 1 | 2657.5 | 0.256 |
| 1590.5 | 1 | 1728 | 0.104 | | |
| 1727.5 | 0.084 | 2611 | 0.280 | | |
| 2568 | 0.120 | | | | |

Similarly, the relative intensity data of the peaks of the spectra in FIG. 8 are as follows:

| Infrared (785 nm) | | Red (633 nm) | | Green (532 nm) | |
| --- | --- | --- | --- | --- | --- |
| Raman shift (cm$^{-1}$) | Relative intensity | Raman shift (cm$^{-1}$) | Relative intensity | Raman shift (cm$^{-1}$) | Relative intensity |
| 102.5 | 0.223 | 65 | 0.310 | 67.5 | 0.139 |
| 146 | 0.352 | 134 | 0.343 | 135.5 | 0.147 |
| 227.5 | 0.641 | 190 | 1.584 | 165 | 0.318 |
| 1289 | 0.102 | 249 | 0.234 | 186.5 | 0.168 |
| 1588 | 1 | 280 | 0.188 | 225.5 | 0.368 |
| 1725 | 0.117 | 1308 | 0.166 | 1337.5 | 0.173 |
| 2560.5 | 0.113 | 1551 | 0.564 | 1590 | 1 |
| | | 1583 | 1 | 2646 | 0.345 |
| | | 2594.5 | 0.420 | | |

The Raman spectroscopy of FIGS. 7 and 8 clearly indicates CNTs with the three characteristic G, D and 2D peaks. A very sharp G peak around 1500 cm$^{-1}$ and a very low D peak around 1310 cm$^{-1}$ can be observed. The various peaks below 250 cm$^{-1}$ (149, 182.5, 205.5 and 228.5 cm$^{-1}$ for the infrared (785 nm) trace in FIG. 7) are the radial breathing modes (RBM) signatures, which are characteristic of single-walled nanotubes (SWNTs). The presence of the left split of the G peak confirms the presence of CNT of very small diameters. Defects are negligible as indicated by the low D/G ratio (0.047 for the infrared (785 nm) trace in FIG. 7).

Further, the similarity of the Raman spectra of FIGS. 7 and 8 indicate that similar, predominantly single-walled, CNTs were produced in both Examples 1 and 2. Smaller diameter tubes are slightly favoured in the more concentrated reaction environment of Example 2 (as indicated by the significantly stronger RBM features).

FIGS. 9, 10 and 11 present TEM images of the CNTs of Example 1, where catalyst precursor (ferrocene) was injected into the afterglow. The synthesised material was dispersed in ethanol to remove it from the filter media on which it was collected. The impurities in the TEM images are over-injected iron particles, debris from the filter medium, and non-CNT carbonaceous impurities. It can be seen that the CNTs are very good quality, predominantly single-walled, of relatively small diameter.

FURTHER EXAMPLES

We produced further quantities of CNTs in accordance with the present work, in these examples with the CNTs having been grown on catalyst-precursor-impregnated substrates. FeN was deposited on an alumina substrate and placed in a reactor tube of about 1.5 m length. Natural gas was passed through the plasma nozzle thereby cracking the hydrocarbon. CNTs were formed on the catalyst particles on the substrate.

FIGS. 12, 13, 14 and 15 present SEM images of the CNTs of these examples. CNTs are observed growing off the fibrous structure of the alumina substrate. The tubes are of varying diameter and curled and randomly oriented.

Figure 16:
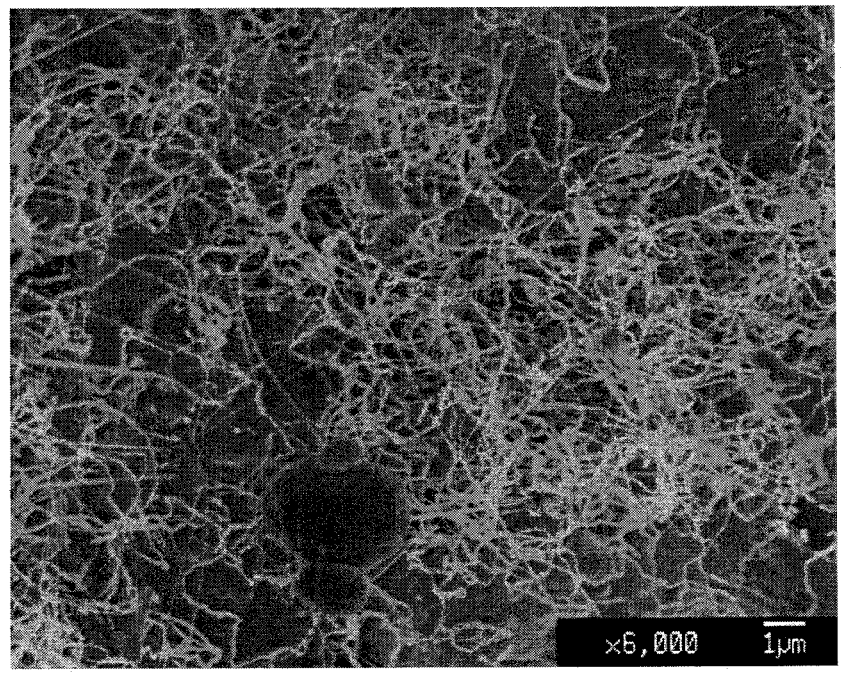
FIGS. 16 and 17 present SEM images of additional CNT samples synthesised in accordance with the present work (with these examples, the CNTs having been grown by feeding Nickel-coated iron wires into the afterglow, to provide the catalyst)
Figure 17:
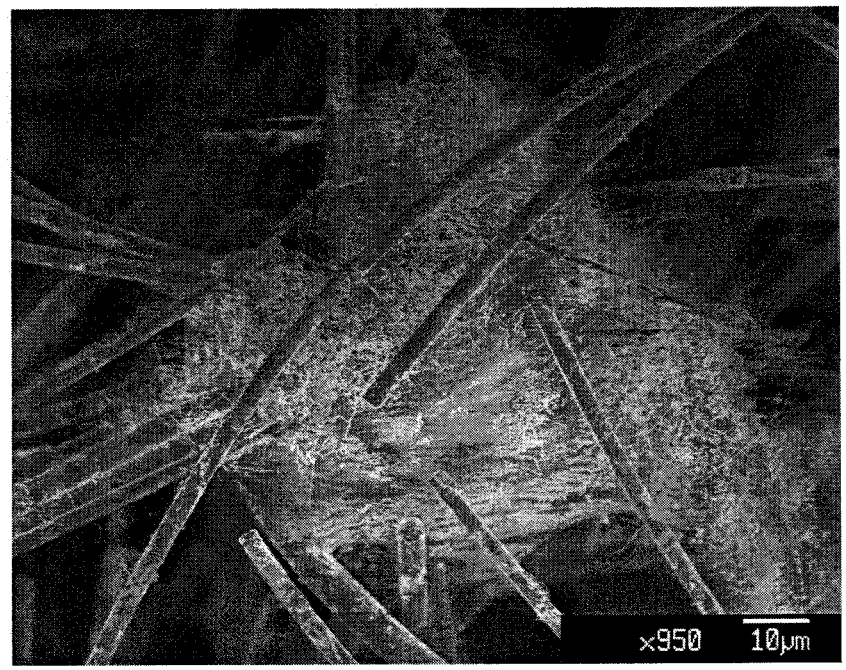

FIGS. 16 and 17 present SEM images of additional CNT samples synthesised in accordance with the present work. With these particular examples, the CNTs were grown by feeding Nickel-coated iron wires into the afterglow, to provide the catalyst. The CNTs were collected on a fibrous filter medium. Examination of these SEM images reveals that these CNT samples predominantly comprise multi-walled nanotubes.

Further Possible Modifications and Alternative Embodiments

Detailed embodiments have been described above, together with some possible modifications and alternatives. However, as those skilled in the art will appreciate, a number of additional modifications and alternatives can be made to the above embodiments whilst still benefiting from the inventions embodied therein.

REFERENCES

[1] lijima S (1991) Helical microtubules of graphitic carbon. Nature 354:56-58.
[2] Harris PJF (2009) Carbon Nanotube Science Synthesis, properties and applications.
[3] Andrews R, Jacques D. Rao A M et al. (1999) Continuous production of aligned carbon nanotubes: a step closer to commercial realization. Chem Phys Lett 303:467-474. doi: 10.1016/S0009-2614(99)00282-1
[4] Bronikowski M J, Willis P A, Colbert D T, et al. (2001) Gas-phase production of carbon single-walled nanotubes from carbon monoxide via the HiPco process: A parametric study. J Vac Sci Technol A 19:1800-1805.
[5] Wang Y, Wei F, Luo G, et al, (2002) The large-scale production of carbon nanotubes in a nano-agglomerate fluidized-bed reactor. Chem Phys Lett 364:568-572. doi: 10.1016/S0009-2614(02)01384-2
[6] Sundaram R M, Koziol K K K, Windle A H (2011) Continuous Direct Spinning of Fibers of Single-Walled Carbon Nanotubes with Metallic Chirality. doi: 10.1002/adma.201102754
[7] Bell et al. (Characterisation of the Growth Mechanism during PECVD of Multiwalled Carbon Nanotubes, Carbon, Vol. 100 Topics in Applied Physics (2006) pp 77-93).
[8] Zajíčlcová et al. (Atmospheric pressure microwave torch for synthesis of carbon nanotubes, Plasma Phys. Control. Fusion 47 (2005) B655-B666), (Characterization of carbon nanotubes deposited in microwave torch at atmospheric pressure, Plasma Process. Polym. 4 (2007) 5245-5249).
[9] Jašek et al. (Carbon nanotubes synthesis in microwave plasma torch at atmospheric pressure, Material Sci. Engin. C 26 (2006) 1189-1193), (Discussion of important factors in deposition of carbon nanotubes by atmospheric pressure microwave plasma torch, Phys. Chem. Solids 68 (2007) 738-743).
[10] Chen et al. (Plasma torch production of macroscopic carbon nanotube structures, Carbon 41 (2003) 2555-2560).

The invention claimed is:

1. A method of synthesising carbon nanotubes, the method comprising:
   supplying a process gas to a plasma nozzle that is coupled to a reaction tube or chamber, the process gas comprising a carbon-containing species, wherein the carbon-containing species comprises a gaseous hydrocarbon, natural gas, $CH_4$, $C_2H_6$, $C_2H_4$, $C_3H_8$, $C_4H_{10}$, a liquid hydrocarbon, a liquefied hydrocarbon, toluene, or ethanol;
   supplying radio frequency radiation to the process gas within the plasma nozzle, so as to sustain a plasma within the plasma nozzle, and thereby cause cracking of the carbon-containing species, wherein the plasma is generated at atmospheric pressure; and
   providing a catalyst;
   wherein the plasma nozzle is arranged such that an afterglow of the plasma extends into the reaction tube/chamber, the cracked carbon-containing species also passes into the reaction tube/chamber, and the cracked carbon-containing species recombines within the afterglow, so as to form carbon nanotubes in the presence of the catalyst; and
   wherein the method further comprises applying cooling to the afterglow on exiting the plasma nozzle.

2. The method according to claim 1, further comprising forming at least one vortex in the process gas within the plasma nozzle, and subjecting said at least one vortex to said radio frequency radiation.

3. The method according to claim 1, wherein the radio frequency radiation comprises microwave radiation.

4. The method according to claim 1, wherein the cooling comprises water cooling or gas cooling.

5. The method according to claim 1, wherein the process gas further comprises a buffer gas, the buffer gas comprising argon, nitrogen, or helium.

6. The method according to claim 1, wherein the process gas further comprises a buffer gas, the buffer gas comprising carbon dioxide.

7. The method according to claim 1, wherein the afterglow within the reaction tube/chamber has an operating temperature of lower than 3500° C., lower than 2000° C., or around 1000° C.

8. The method according to claim 1, further comprising extracting the carbon nanotubes using a continuous extraction process.

9. The method according to claim 1, wherein the carbon-containing species is cracked without the process gas being introduced into a thermal zone; and wherein no external heating is applied during the formation of the carbon nanotubes.

* * * * *